United States Patent
Nomura

(10) Patent No.: US 11,056,636 B2
(45) Date of Patent: Jul. 6, 2021

(54) OSCILLATOR, METHOD OF MANUFACTURING OSCILLATOR, ELECTRONIC APPARATUS, AND VEHICLE

(71) Applicant: SEIKO EPSON CORPORATION, Tokyo (JP)

(72) Inventor: Norio Nomura, Minowa-Machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/774,613

(22) Filed: Jan. 28, 2020

(65) Prior Publication Data

US 2020/0243746 A1 Jul. 30, 2020

(30) Foreign Application Priority Data

Jan. 30, 2019 (JP) .............................. JP2019-014056

(51) Int. Cl.
  *H03B 1/00* (2006.01)
  *H01L 41/053* (2006.01)
  *H03B 5/32* (2006.01)

(52) U.S. Cl.
  CPC ........... *H01L 41/0533* (2013.01); *H03B 5/32* (2013.01); *H03B 2200/0022* (2013.01)

(58) Field of Classification Search
  CPC ................ H01L 41/0533; H03B 5/32; H03B 2200/0022
  USPC .......................................................... 331/68
  See application file for complete search history.

(56) References Cited

U.S. PATENT DOCUMENTS

| 6,079,099 A * | 6/2000 | Uchida ................ H05K 3/3405 174/382 |
| 8,212,339 B2 * | 7/2012 | Liao ...................... H01L 23/552 257/659 |
| 2011/0221535 A1 * | 9/2011 | Sakaba ................ H03H 9/1021 331/68 |
| 2014/0151105 A1 * | 6/2014 | Kuwahara .............. H05K 1/181 174/260 |
| 2015/0255702 A1 | 9/2015 | Takebayashi et al. |
| 2018/0234052 A1 * | 8/2018 | Noto ................... H03H 9/02102 |

FOREIGN PATENT DOCUMENTS

| JP | 2003-204161 | 7/2003 |
| JP | 2004-022605 | 1/2004 |
| JP | 2015-170827 | 9/2015 |

* cited by examiner

Primary Examiner — Richard Tan
(74) Attorney, Agent, or Firm — Workman Nydegger

(57) ABSTRACT

An oscillator includes a substrate having a first substrate main surface and a substrate side surface, and a lid body bonded to the substrate and including a metal material, in which the substrate includes a substrate body having a first substrate body main surface corresponding to the first substrate main surface and a substrate body side surface corresponding to the substrate side surface, and provided with a cutout portion in the substrate body side surface, a side surface wiring provided along the cutout portion, a filling member provided in the cutout portion, and an insulating coating member provided on the first substrate body main surface.

11 Claims, 16 Drawing Sheets

OSCILLATOR, METHOD OF MANUFACTURING OSCILLATOR, ELECTRONIC APPARATUS, AND VEHICLE

The present application is based on, and claims priority from JP Application Serial Number 2019-014056, filed Jan. 30, 2019, the disclosure of which is hereby incorporated by reference herein in its entirety.

BACKGROUND

1. Technical Field

The present disclosure relates to an oscillator, a method of manufacturing the oscillator, an electronic apparatus, and a vehicle.

2. Related Art

An oscillator using a quartz crystal resonator is widely used as a reference frequency source, an oscillation source, or the like of various electronic apparatus.

For example, in JP-A-2015-170827, an oscillator is disclosed, the oscillator including abase substrate including a cutout portion and a castellation (metal film) provided in the cutout portion, a lid bonded to the base substrate, and a quartz crystal resonator piece housed in a package constituted with the base substrate and the lid. Further, it is disclosed that the castellation provided in the cutout portion of the base substrate is electrically connected to an internal terminal or an external connection terminal provided in the base substrate. Furthermore, the lid (lid member) described in JP-A-2015-170827 has a box shape having a recess portion which is open on a base substrate side, and on a side surface thereof, a missing portion which opens a surface of the base substrate side is formed. It is disclosed that contact between the lid and the internal terminal is prevented by the missing portion.

In a package as shown in JP-A-2015-170827, outside air enters the package through a missing portion. As a result, a temperature in the package is easy to be affected by the outside air temperature, so there is an issue that a frequency of an output signal is also easily changed. However, in the package described in JP-A-2015-170827, an internal terminal is exposed on an upper surface of a base substrate. Therefore, in order to prevent contact between a lid and the internal terminal, there is a problem in which a missing portion has to be provided.

SUMMARY

An oscillator according to an application example of the present disclosure includes a substrate having a first substrate main surface and a substrate side surface, and a lid body bonded to the substrate and including a metal material, in which the substrate includes a substrate body having a first substrate body main surface corresponding to the first substrate main surface and a substrate body side surface corresponding to the substrate side surface, and provided with a cutout portion in the substrate body side surface, a side surface wiring provided along the cutout portion, a filling member provided in the cutout portion, and an insulating coating member provided on the first substrate body main surface.

DESCRIPTION OF EXEMPLARY EMBODIMENTS

Hereinafter, preferred embodiments of an oscillator, a method of manufacturing the oscillator, an electronic apparatus, and a vehicle according to the present disclosure will be described in detail with reference to the accompanying drawings.

First, prior to description of the embodiment, a problem to be solved by the present embodiment will be described with a reference example.

Figure 23:
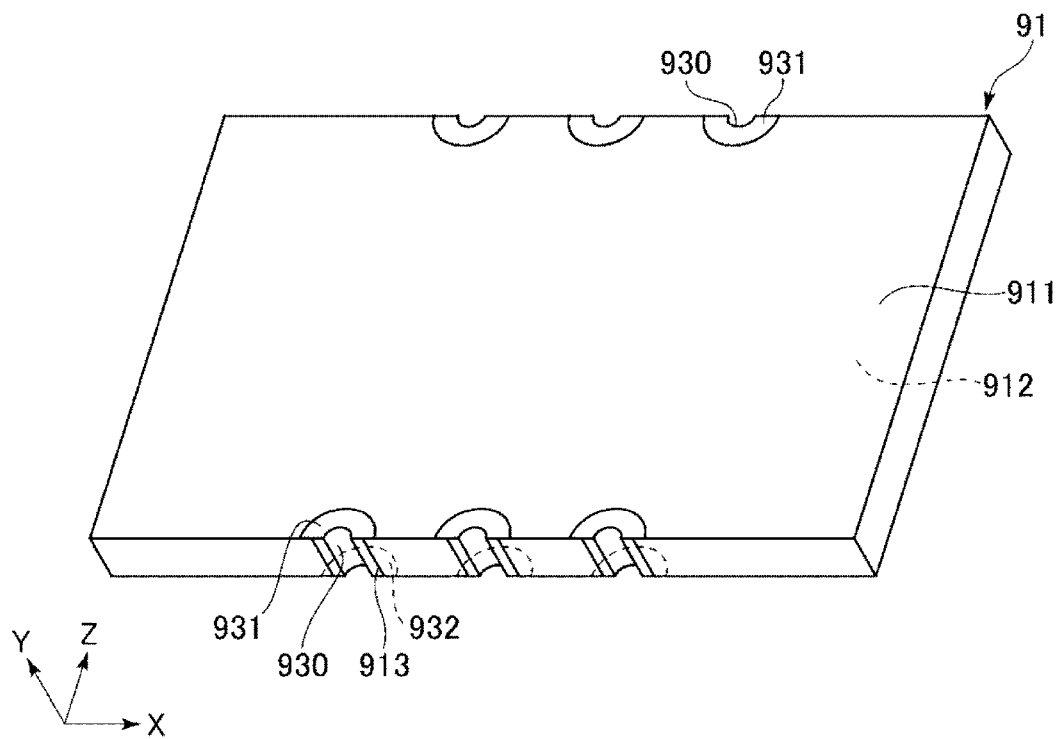
FIG. 23 is a perspective view showing a base substrate provided in an oscillator of a reference example.
Figure 24:
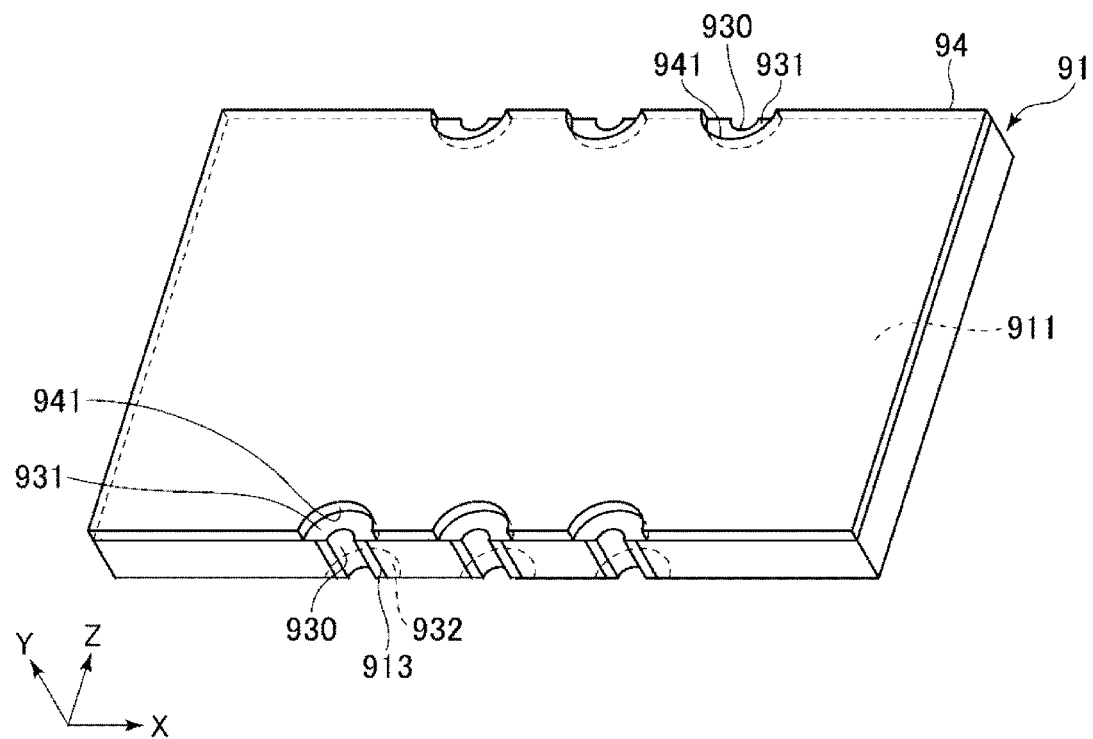
FIG. 24 is a perspective view showing the base substrate provided in the oscillator of the reference example.
Figure 25:
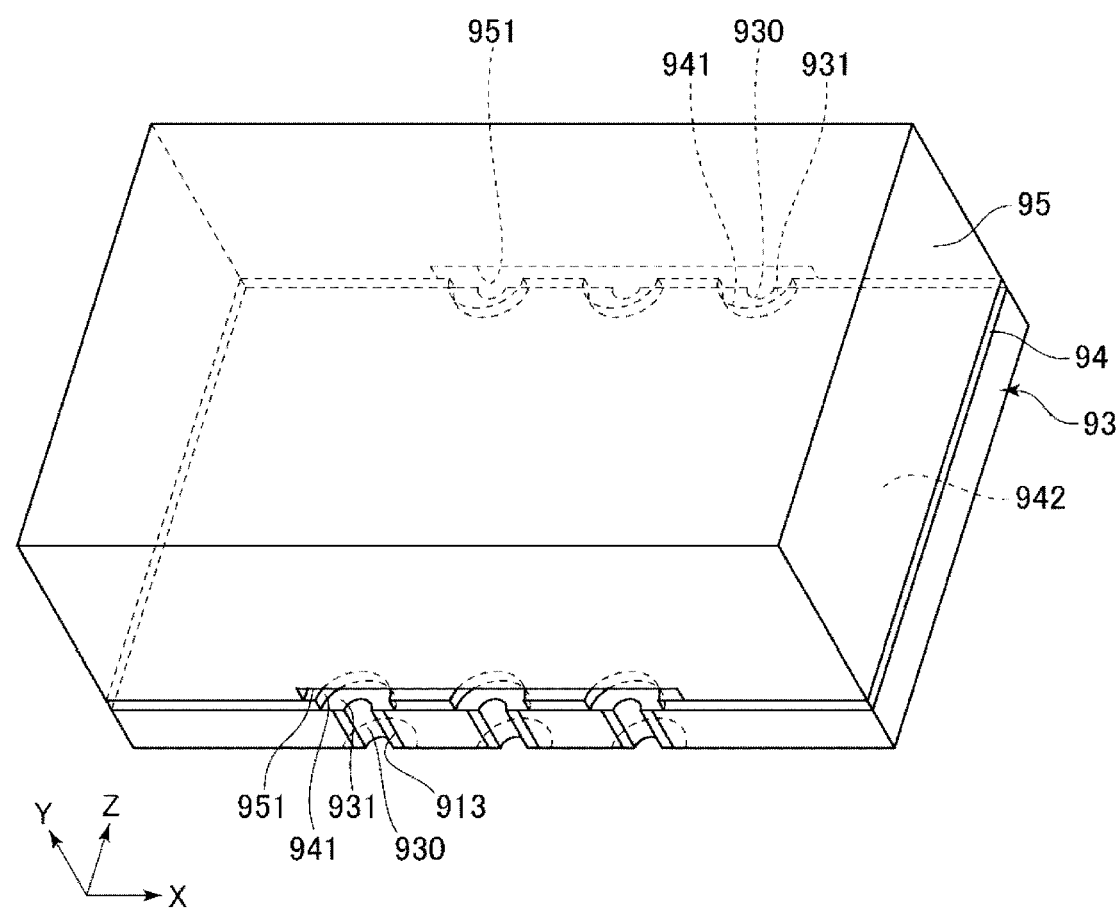
FIG. 25 is a perspective view showing a container provided in the oscillator of the reference example.

FIG. 23 and FIG. 24 are perspective views showing base substrates provided in the oscillator of the reference example, respectively. FIG. 25 is a perspective view showing a container provided in the oscillator of the reference example. In FIG. 23, FIG. 24, and FIG. 25, description will be made assuming that three axes orthogonal to each other are an X-axis, a Y-axis, and a Z-axis, a +Y-axis direction is "up", and a −Y-axis direction is "down".

A base substrate 91 shown in FIG. 23 includes an upper surface 911 and a lower surface 912, and a cutout portion 913 which penetrates the base substrate 91 in a thickness direction from the upper surface 911 to the lower surface 912. The cutout portion 913 is provided on long sides of the upper surface 911 and the lower surface 912 which respectively form a rectangular shape, facing each other. Further, a metal film 930 is provided on an inner surface of the cutout portion 913, and is electrically connected with an internal terminal 931 provided on the upper surface 911 and an external connection terminal 932 provided on the lower surface 912.

FIG. 24 is a view showing a state in which a resist film 94 is provided so as to cover the upper surface 911 of the base substrate 91 shown in FIG. 23. The resist film 94 substantially covers the entire surface of the upper surface 911 of the base substrate 91. On the other hand, the resist film 94 is formed so as not to overlap the internal terminal 931. That is, the resist film 94 includes a resist cutout portion 941 provided at a portion corresponding to the internal terminal 931. Accordingly, when the resist film 94 is formed, it is possible to prevent a film forming material which is a raw material of the resist film 94 from dripping into the metal film 930. As a result, when the oscillator including the base substrate 91 is mounted on an external substrate or the like, it is possible to prevent spreading of a bonding material such as solder to the metal film 930 from being hindered by the draping resist film 94.

FIG. 25 is a view showing a state in which a lid body 95 is disposed so as to cover an upper surface 942 of the resist film 94 shown in FIG. 24. The lid body 95 has a rectangular shape having a recess portion which is open at a bottom thereof, and a missing portion 951 whose lower surface is open is formed on a side surface thereof. The missing portion 951 is provided to correspond to a position of the cutout portion 913 described above, that is, a position of the metal film 930. As a result, contact between the lid body 95, and the metal film 930 or the internal terminal 931 is prevented.

On the other hand, among oscillators, an oscillator used for a reference frequency source such as a communication device and a measuring instrument is required to have an output frequency which is stable with high precision against temperature changes. For such a use, for example, a thermostatic chamber integrated quartz crystal oscillator OCXO (oven controlled x'tal oscillator) is used.

In an OCXO, for example, a thermostatic chamber is accommodated in the aforementioned package, and a quartz crystal resonator piece is accommodated in the thermostatic chamber. In addition, a temperature control element configured to control a temperature of the quartz crystal resonator piece is accommodated in the thermostat chamber so that the temperature of the quartz crystal resonator piece falls within a predetermined range. As a result, even when an outside air temperature changes, precision of an output frequency can be increased.

However, in a package shown in FIG. 25, since the missing portion 951 is formed in the lid body 95, there is an issue that outside air enters the package through the missing portion 951. As a result, the temperature in the package is easily affected by the outside air temperature, and when the outside air temperature becomes extremely low or high, there is an issue that a temperature in the thermostatic chamber is affected by the outside air temperature. As a result, the temperature in the thermostatic chamber deviates from the predetermined temperature range, and the precision of the output frequency of the oscillator decreases.

Therefore, the present inventor repeatedly studied a structure capable of preventing electrical contact between the lid body 95 and the metal film 930 without providing the missing portion 951, and completed the present disclosure. Hereinafter, embodiments of the present disclosure will be described.

Oscillator

First Embodiment

As an example of an oscillator 1 according to a first embodiment, the quartz crystal oscillator with the thermostat chamber (OCXO) having an SC cut quartz crystal resonator element with excellent frequency stability will be described.

Figure 1:
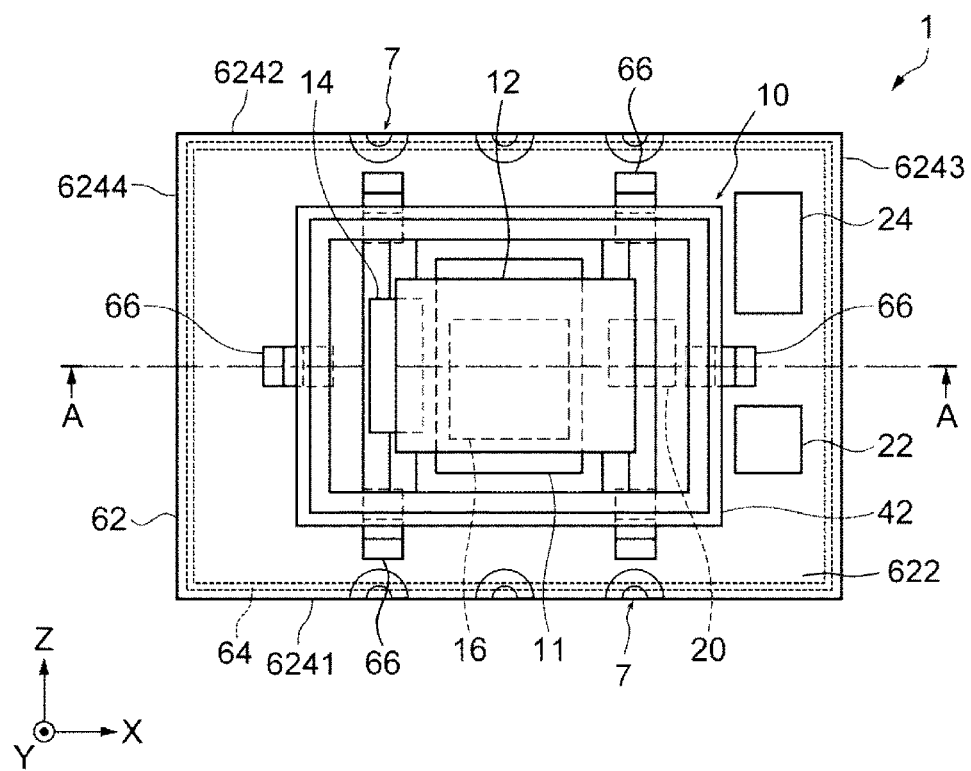
FIG. 1 is a plan view showing a structure of an oscillator according to a first embodiment.
Figure 2:
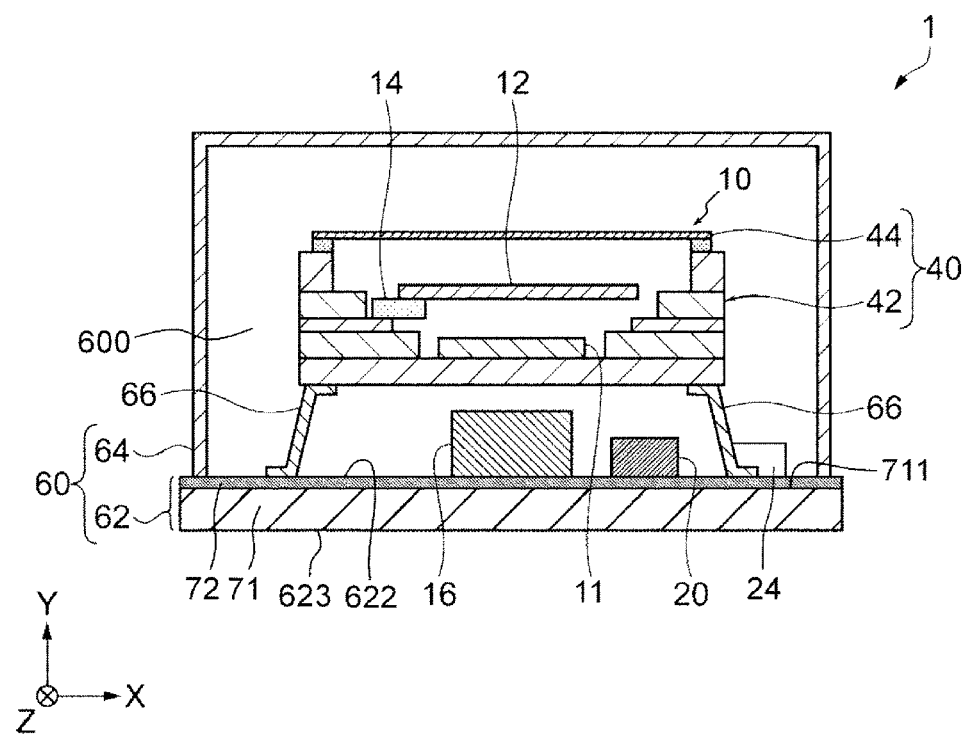
FIG. 2 is a sectional view taken along line A-A in FIG. 1.
Figure 3:
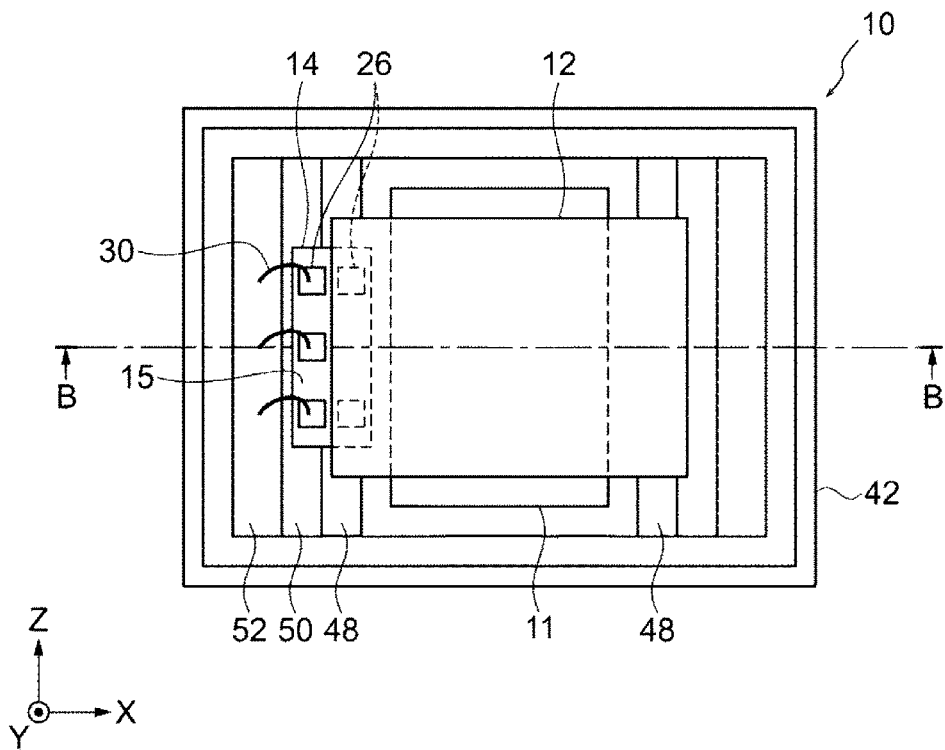
FIG. 3 is a plan view schematically showing a container included in the oscillator shown in FIG. 1.
Figure 4:
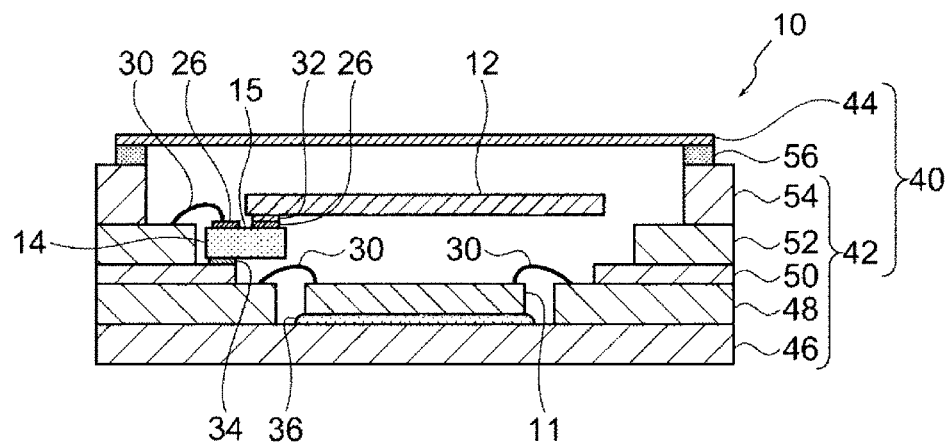
FIG. 4 is a sectional view taken along line B-B in FIG. 3.

FIG. 1 is a plan view showing a structure of the oscillator 1 according to the first embodiment. FIG. 2 is a sectional view taken along line A-A in FIG. 1. FIG. 3 is a plan view schematically showing a container 40 included in the oscillator shown in FIG. 1. FIG. 4 is a sectional view taken along line B-B in FIG. 3. FIG. 1 shows a state in which a lid body is removed, and FIG. 3 shows a state in which the lid is removed, respectively. Further, for convenience of explanation, including the drawings described later, the X-axis, the Y-axis, and the Z-axis are illustrated as three axes orthogonal to each other. Furthermore, for convenience of explanation, in plan view when viewed from the Y-axis direction, a surface of the +Y-axis direction is described as an upper surface, and a surface of the −Y-axis direction is described as a lower surface. In addition, the plan view in the present disclosure means a plan view when viewed from the Y-axis direction. In some of the drawings, illustration of parts not related to the description is omitted.

As shown in FIG. 2, the oscillator 1 includes a package 60 having a mounting substrate 62 having an upper surface 622 (first substrate main surface) and a lower surface 623 (second substrate main surface) and a lid body 64 provided on the upper surface 622 of the mounting substrate 62. In an accommodation space 600 inside the package 60, a resonator 10 disposed on the upper surface 622 of the mounting substrate 62 is accommodated via a lead frame 66. As a result, the resonator 10 is disposed to be spaced upward from the mounting substrate 62. Further, the accommodation space 600 accommodates a circuit element 16 and circuit components 20, 22, and 24 such as a plurality of capacitors and resistors disposed on the upper surface 622 of the mounting substrate 62.

As for a constituent material of the lid body 64 and the lead frame 66 of the package 60, it is preferable that a material obtained by applying nickel plating to an iron-based alloy having a low thermal conductivity such as an iron-nickel alloy such as 42 alloy, is used.

As for a constituent material of the lid body 64, a metal material may be used, or a composite material of a metal material and a resin material may be used. Among these, the constituent material of the lid body 64 includes the metal material, so that the package 60 can be provided with a shield effect which shields or attenuates electromagnetic noise from the outside.

The accommodation space 600 may be, for example, air atmosphere and may not be hermetically sealed, but may be hermetically sealed in reduced-pressure atmosphere such as vacuum or inert gas atmosphere such as nitrogen, argon, and helium.

The resonator 10 includes the container 40. As shown in FIG. 3 or FIG. 4, the container 40 accommodates an integrated circuit 11 including an oscillation circuit, an output circuit, or the like, a temperature control element 14, and a resonator element 12 which is an SC cut quartz crystal resonator element. The container 40 is hermetically sealed in reduced-pressure atmosphere such as vacuum or an inert gas atmosphere such as nitrogen, argon, and helium.

As shown in FIG. 3 or FIG. 4, the container 40 has a container body 42 and a lid 44. Among these, the container body 42 is formed by stacking a first substrate 46, a second substrate 48, a third substrate 50, a fourth substrate 52, and a fifth substrate 54 as shown in FIG. 4. The second substrate 48, the third substrate 50, the fourth substrate 52, and the fifth substrate 54 have an annular shape with a center portion thereof removed, respectively. A sealing member 56 such as seal ring or low-melting glass is disposed on a peripheral edge of an upper surface of the fifth substrate 54. The lid 44 is bonded via the sealing member 56. A constituent material of the first substrate 46, the second substrate 48, the third substrate 50, the fourth substrate 52, and the fifth substrate 54 is, for example, ceramics. Further, a constituent material of the lid 44 is, for example, a metal such as Kovar.

Further, the second substrate 48 and the third substrate 50 form a cavity which houses the integrated circuit 11, and the fourth substrate 52 and the fifth substrate 54 form a cavity which houses the temperature control element 14 and the resonator element 12.

The integrated circuit 11 is bonded to an upper surface of the first substrate 46 via a bonding member 36. The integrated circuit 11 is electrically connected to an electrode pad (not shown) disposed on an upper surface of the second substrate 48 via the bonding wire 30.

The integrated circuit 11 includes, for example, an oscillation circuit causing the resonator element 12 to oscillate, a multiplication circuit multiplying a frequency signal outputted from the resonator element 12, an output circuit outputting the frequency signal, or the like. Some of circuit elements constituting the oscillation circuit, the multiplication circuit, the output circuit, or the like may be provided outside the integrated circuit 11 as the circuit element 16 or the like described above. Further, the integrated circuit 11 may be integrated with an element other than these circuits.

Further, the temperature control element 14 is bonded to an upper surface of the third substrate 50 via a bonding member 34. An electrode pad 26 formed on an active surface 15 which is an upper surface of the temperature control element 14 is electrically connected to an electrode pad (not shown) disposed on the upper surface of the fourth substrate 52 via a bonding wire 30.

The temperature control element 14 includes, for example, a heating element (not shown) disposed at a position overlapping the resonator element 12 in plan view, a temperature sensitive element (not shown) used for temperature measurement, and a control circuit (not shown) controlling an amount of heat generated by a heating body. The temperature control element 14 is, for example, an integrated circuit. The heating body is, for example, a resistor integrated in the temperature control element 14. Further, the temperature sensitive element may be, for example, a diode element integrated in the temperature control element 14, and may be constituted so that a voltage at both ends thereof changes substantially linearly with respect to a temperature change by passing a constant forward direction current.

By adjusting the amount of heat generated by the heating body, a temperature of the resonator element 12 can be controlled within a certain range. Therefore, the container 40 which houses the temperature control element 14 functions as a so-called thermostatic chamber.

In the temperature control element 14, the heating body, the temperature sensitive element, and the control circuit are integrated, but these may be separate from each other. In this case, for example, the temperature sensitive element is disposed in a vicinity of the resonator element 12 and measures the temperature of the resonator element 12. Examples of such temperature sensitive elements include a negative temperature coefficient (NTC) thermistor, a positive temperature coefficient (PTC) thermistor, a platinum resistor, or the like.

The resonator element 12 is disposed on the active surface 15 of the temperature control element 14. The resonator element 12 according to the present embodiment is the SC cut quartz crystal resonator element as described above. Since the SC cut quartz crystal resonator element has a low external stress sensitivity, it has excellent frequency stability.

The resonator element 12 is not limited to the rectangular SC cut quartz crystal resonator element as shown in FIG. 3, and may be a circular SC cut quartz crystal resonator element and may be a rectangular or circular AT CUT quartz crystal resonator element, tuning fork type quartz crystal resonator element, surface acoustic wave resonator element, other piezoelectric resonator element, micro electro mechanical systems (MEMS) resonator element, or the like.

Further, an electrode pad (not shown) provided on a lower surface of the resonator element 12 and the electrode pad 26 provided on the active surface 15 are bonded to each other via a bonding member 32 such as a metal bump and a conductive adhesive. Further, an excitation electrode (not shown) is formed on upper and lower surfaces of the resonator element 12, and the excitation electrode and the electrode pad (not shown) provided on the lower surface of the resonator element 12 are electrically connected to each other.

Since it is preferable that the resonator element 12 and the temperature control element 14 are connected to each other so that heat generated in the temperature control element 14 is transmitted to the resonator element 12, for example, the resonator element 12 and the temperature control element 14 may be connected to each other via an insulating bonding member while the resonator element 12 and the temperature control element 14 or the resonator element 12 and the container body 42 may be electrically connected to each other via a conductive member such as a bonding wire.

Figure 5:
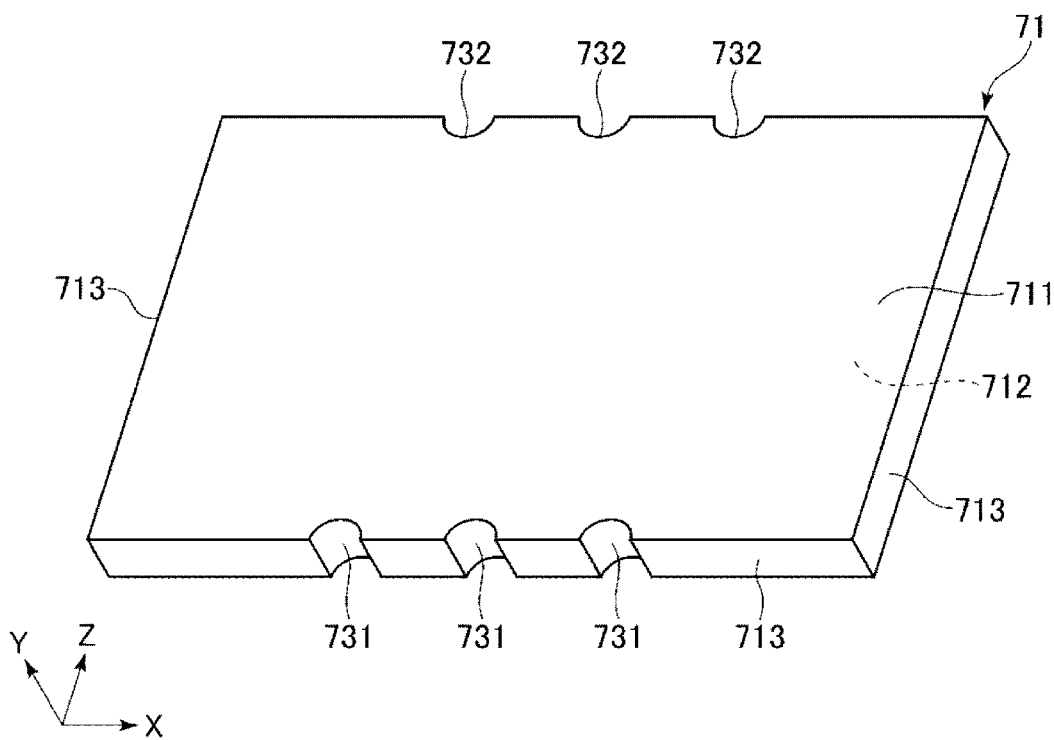
FIG. 5 is a perspective view showing only a substrate body included in a package shown in FIG. 2.
Figure 6:
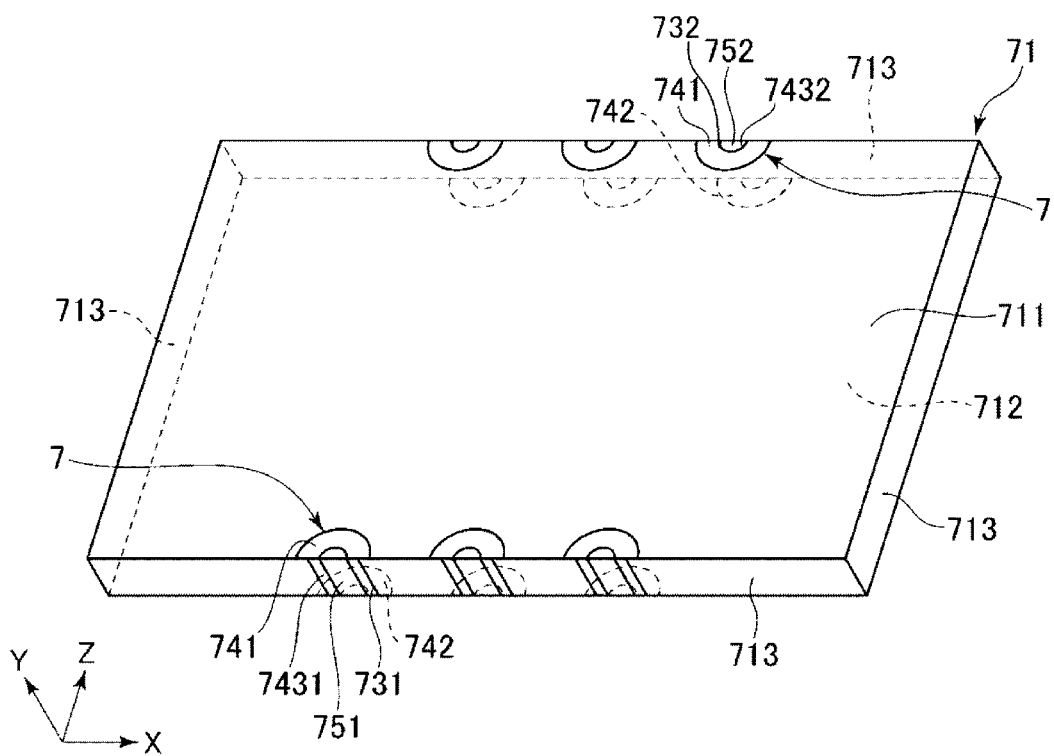
FIG. 6 is a perspective view showing a state in which a terminal, wiring, or the like are formed on the substrate body shown in FIG. 5 in a partially transparent manner.
Figure 7:
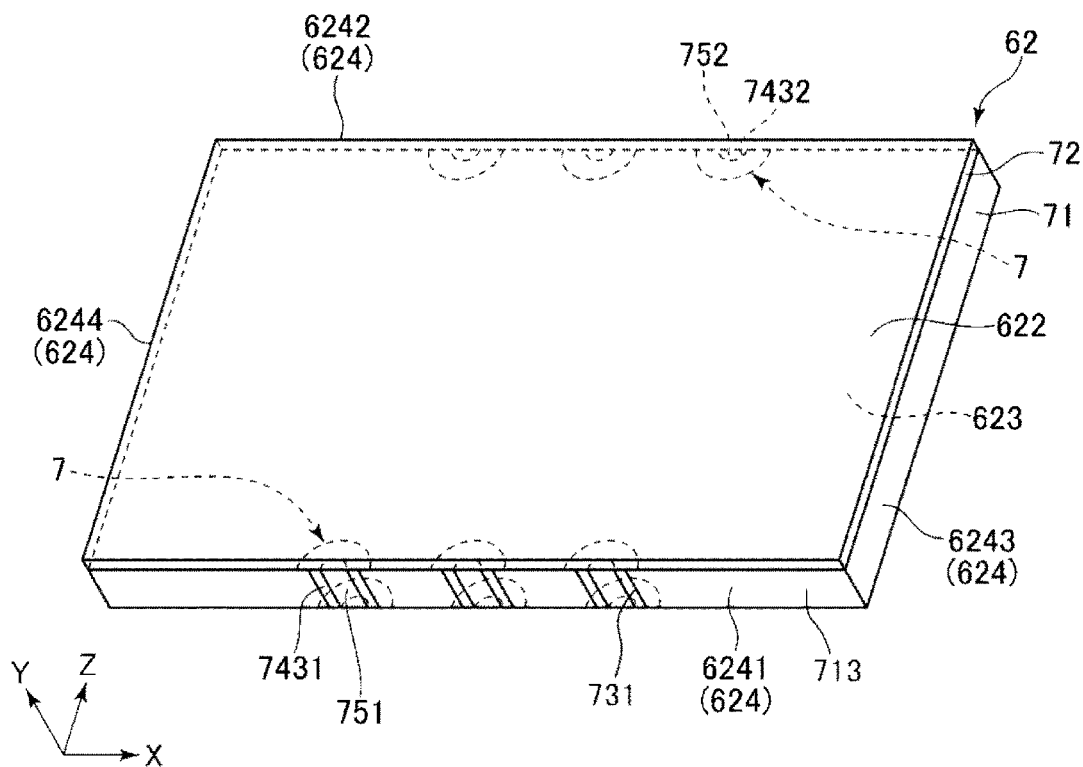
FIG. 7 is a perspective view showing a mounting substrate in which a coating member is formed on the substrate body shown in FIG. 6 in a partially transparent manner.
Figure 8:
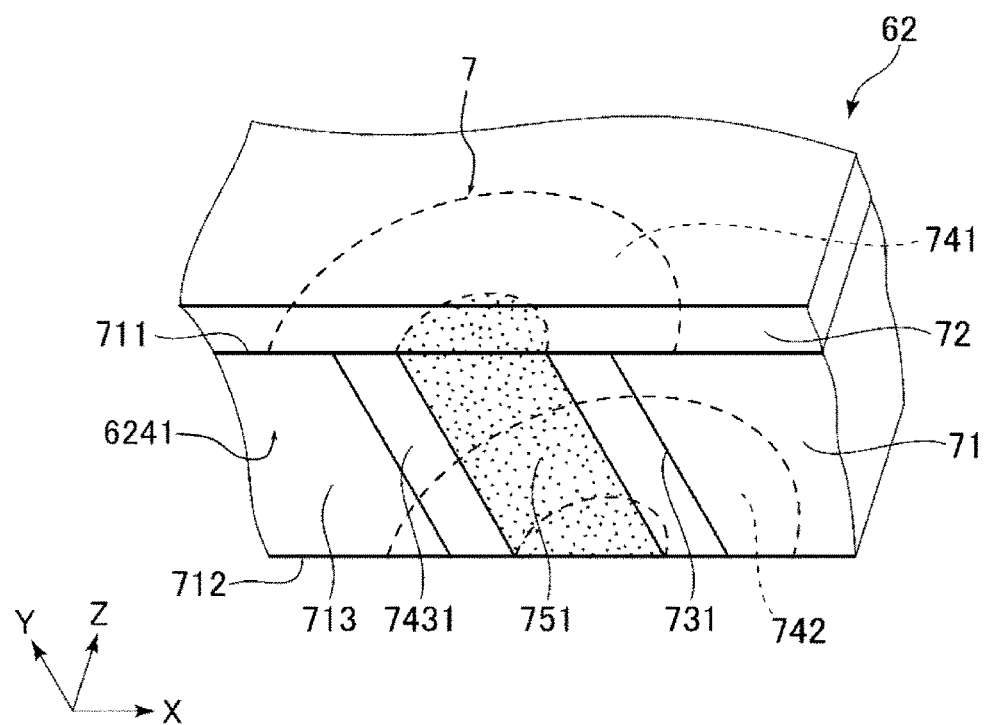
FIG. 8 is a partially enlarged view of FIG. 7.
Figure 9:
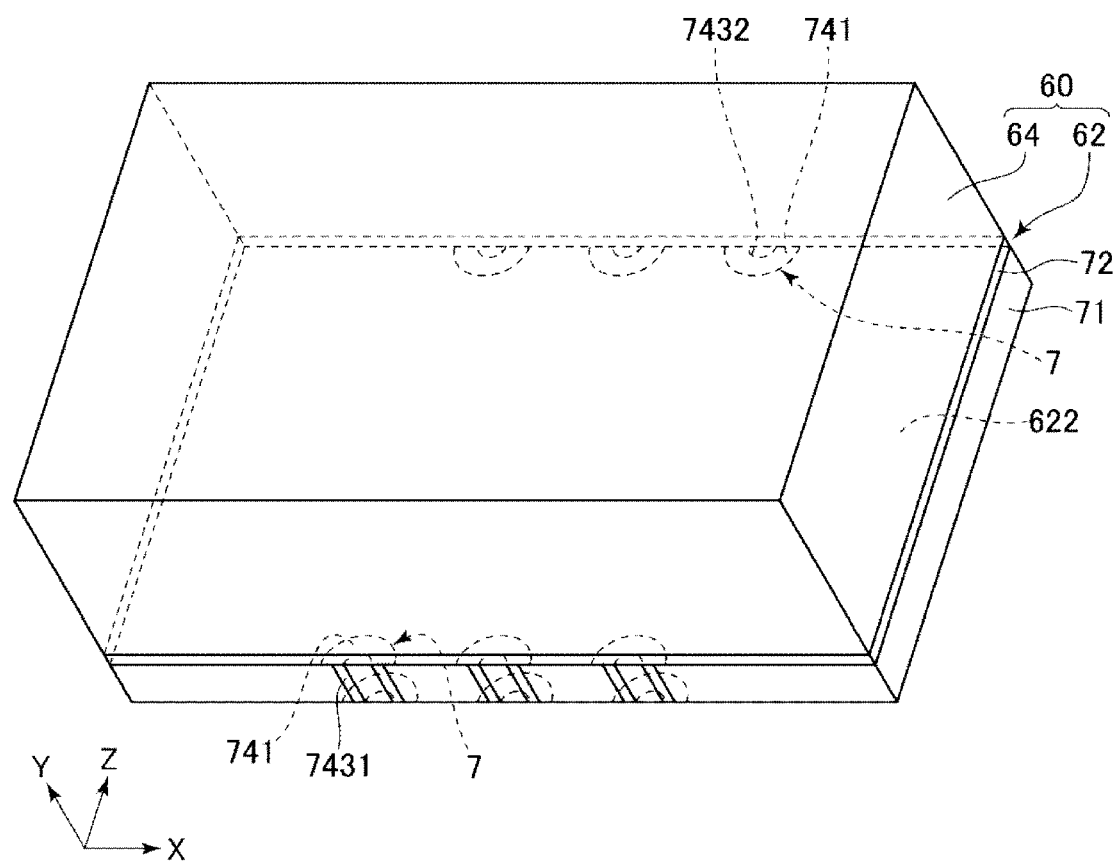
FIG. 9 is a perspective view showing the package shown in FIG. 2 in a partially transparent manner.

Here, FIG. 5 is a perspective view showing only a substrate body 71 included in the package 60 shown in FIG. 2. FIG. 6 is a perspective view showing a state in which a terminal, wiring, or the like are formed on the substrate body 71 shown in FIG. 5 in a partially transparent manner. FIG. 7 is a perspective view showing the mounting substrate 62 in which a coating member 72 is formed on the substrate body 71 shown in FIG. 6 in a partially transparent manner. FIG. 8 is a partially enlarged view of FIG. 7. FIG. 9 is a perspective view showing the package 60 shown in FIG. 2 in a partially transparent manner.

As shown in FIG. 7, the mounting substrate 62 has a substrate side surface 624 as a surface connecting the upper surface 622 with the lower surface 623. A shape of the mounting substrate 62 in plan view is not particularly limited, but is a rectangle in the present embodiment. Accordingly, the mounting substrate 62 shown in FIG. 1 has four substrate side surfaces 624. Among these, when the center of the mounting substrate 62 is used as a reference, the surface positioned in the −Z-axis direction is referred to as a "first substrate side surface 6241", the surface positioned in the +Z-axis direction is referred to as a "second substrate side surface 6242", the surface positioned in the +X-axis direction is referred to as a "third substrate side surface 6243", and the surface positioned in the −X-axis direction is referred to as a "fourth substrate side surface 6244". That is, the first substrate side surface 6241 and the second substrate side surface 6242 face each other, and the third substrate side surface 6243 and the fourth substrate side surface 6244 face each other.

As shown in FIGS. 6 to 9, the mounting substrate 62 has castellation structures 7 provided respectively to correspond to the first substrate side surface 6241 and the second substrate side surface 6242. Hereinafter, the castellation structure 7 will be described.

The mounting substrate 62 includes the substrate body 71 and the film-shaped coating member 72 provided on an upper surface 711 (first substrate body main surface) of the substrate body 71.

Among these, the substrate body 71 has a substantially rectangular shape in plan view as shown in FIG. 5. The substrate body 71 includes three first cutout portions 731, 731, and 731 provided to correspond to the first substrate side surface 6241 described above. The three first cutout portions 731 are formed so as to penetrate from the upper surface 711 to a lower surface 712 (second substrate body main surface) of the substrate body 71, respectively. Further, the first cutout portion 731 shown in FIG. 5 has a cylindrical body shape whose bottom surface is a semicircle, and an inner surface thereof is a curved surface which is recessed toward an inside of the substrate body 71.

Further, as shown in FIG. 6, the mounting substrate 62 further includes an internal terminal 741 provided so as to surround the first cutout portion 731 in the upper surface 711 of the substrate body 71, an external connection terminal 742 provided so as to surround the first cutout portion 731 in the lower surface 712 of the substrate body 71, and a first side surface wiring 7431 provided along an inner surface of the first cutout portion 731. In other words, the internal terminal 741 is constituted with a conductive film provided so as to spread on the upper surface 711 from an upper end of the first side surface wiring 7431 provided in the first cutout portion 731, and the external connection terminal 742 is constituted with the conductive film provided so as to spread on the lower surface 712 from an lower end of the first side surface wiring 7431. The internal terminal 741 is electrically connected to the resonator 10 described above and other elements, components, or the like. Further, the external connection terminal 742 is responsible for mechanical and electrical connection when the oscillator 1 is mounted on an external substrate or the like. The first side surface wiring 7431 is wiring provided on the inner surface of the first cutout portion 731, and electrically connects the internal terminal 741 with the external connection terminal 742. In the present disclosure, the first side surface wiring 7431 provided in the first cutout portion 731 is referred to as the castellation structure 7.

In addition, as shown in FIG. 6, the mounting substrate 62 further includes a first filling member 751 provided in the first cutout portion 731. The first filling member 751 is provided so as to fill the inside of the first cutout portion 731. As a result, a surface of the first filling member 751 which is orthogonal to the Z-axis direction is positioned in the same plane as a substrate body side surface 713 of the substrate body 71, as shown in FIG. 6. Further, a surface of the first filling member 751 which is orthogonal to the Y-axis direction is also positioned in the same surface as the upper surface 711 or the lower surface 712 of the substrate body 71 as shown in FIG. 5.

On the other hand, as shown in FIG. 5, the substrate body 71 includes three second cutout portions 732, 732, and 732 provided to correspond to the second substrate side surface 6242 described above. The three second cutout portions 732 are formed so as to penetrate from the upper surface 711 to the lower surface 712 of the substrate body 71, respectively. Further, the second cutout portion 732 shown in FIG. 5 has a cylindrical body shape whose bottom surface is a semicircle, and an inner surface thereof is a curved surface which is recessed toward an inside of the substrate body 71.

Further, as shown in FIG. 6, the mounting substrate 62 further includes the internal terminal 741 provided in a vicinity of the second cutout portion 732 of the upper surface 711 of the substrate body 71, the external connection terminal 742 provided in a vicinity of the second cutout portion 732 of the lower surface 712 of the substrate body 71, and a second side surface wiring 7432 provided along an inner surface of the second cutout portion 732. In other words, the internal terminal 741 is constituted with a conductive film provided so as to spread on the upper surface 711 from an upper end of the second side surface wiring 7432 provided in the second cutout portion 732, and the external connection terminal 742 is constituted with the conductive film provided so as to spread on the lower surface 712 from an lower end of the second side surface wiring 7432. The second side surface wiring 7432 is wiring provided on the inner surface of the second cutout portion 732, and electrically connects the internal terminal 741 with the external connection terminal 742. In the present disclosure, the second side surface wiring 7432 provided in the second cutout portion 732 is referred to as the castellation structure 7.

In addition, as shown in FIG. 7, the mounting substrate 62 further includes a second filling member 752 provided in the second cutout portion 732. The second filling member 752 is provided so as to fill the inside of the second cutout portion 732. As a result, a surface of the second filling member 752 which is orthogonal to the Z-axis direction is positioned in the same plane as the substrate body side surface 713 of the substrate body 71, as shown in FIG. 6. Further, a surface of the second filling member 752 which is orthogonal to the Y-axis direction is also positioned in the same surface as the upper surface 711 of the substrate body 71 as shown in FIG. 6.

As shown in FIGS. 7 and 8, the coating member 72 described above is provided so as to cover not only the upper surface 711 of the substrate body 71 but also the upper end of the first side surface wiring 7431 and an upper surface of the first filling member 751. Similarly, the coating member 72 is provided so as to cover the upper end of the second side surface wiring 7432 and an upper surface of the second filling member 752 as shown in FIG. 7. In other words, since the inside of the first cutout portion 731 is filled with the first filling member 751 and the inside of the second cutout portion 732 is filled with the second filling member 752, the coating member 72 provided on the upper surface 711 of the substrate body 71 can also be extended to the upper surface of the first filling member 751 and the upper surface of the second filling member 752. In this manner, the upper surface 622 of the mounting substrate 62 can be covered with the coating member 72 up to an outer edge thereof, and at least in a region overlapping with the lid body 64, it is possible to prevent a portion having a conductivity from being exposed.

The lid body 64 is bonded to the upper surface 622 of the mounting substrate 62 as shown in FIGS. 1, 2, and 9. Therefore, there is no possibility that a portion having a conductivity is exposed on a bond surface of the lid body 64, and electrical contact between the lid body 64, and the internal terminal 741 or the first side surface wiring 7431 and the second side surface wiring 7432 is prevented. Therefore, it is not necessary to provide the missing portion 951 as in the reference example in the lid body 64, and it is possible to bond the lid body 64 to the mounting substrate 62 with no gap. Accordingly, in the package 60, since inflow of external air does not occur via the missing portion 951 formed in the lid body 64 or an amount of the inflow can be suppressed to be less, heat insulation is increased. As a result, since the temperature in the thermostatic chamber is not easily affected by the outside air temperature and the temperature in the thermostatic chamber is easily maintained within a predetermined range, the precision of the output frequency of the oscillator 1 can be stabilized.

As described above, the oscillator 1 according to the present embodiment includes the upper surface 622 (first substrate main surface), the lower surface 623 (second substrate main surface) having a front and back relationship with the upper surface 622, the mounting substrate 62 having the substrate side surface 624, and the lid body 64 bonded to the mounting substrate 62 and including a metal material. The mounting substrate 62 includes the substrate body 71 which has the upper surface 711 (first substrate body main surface) corresponding to the upper surface 622 (first substrate main surface) and the substrate body side surface 713 corresponding to the substrate side surface 624 and which is provided with the first cutout portion 731 on the substrate body side surface 713, the first side surface wiring 7431 provided along the first cutout portion 731, the first filling member 751 provided in the first cutout portion 731, and the insulating coating member 72 provided on the upper surface 711 on the substrate body 71.

According to such an oscillator 1, the coating member 72 can insulate the first side surface wiring 7431 or the internal terminal 741 electrically connected thereto from the lid body 64. Therefore, it is not necessary to provide the missing portion in the lid body 64 as in the reference example. Accordingly, heat insulation of the package 60 constituted with the mounting substrate 62 and the lid body 64 is increased, and a temperature inside the resonator 10 accommodated in the package 60 can be easily maintained at a predetermined temperature. As a result, the precision of the output frequency of the oscillator 1 can be stabilized.

The coating member 72 may not be covered, for example, in a region in which a component or the like is mounted.

Figure 10:
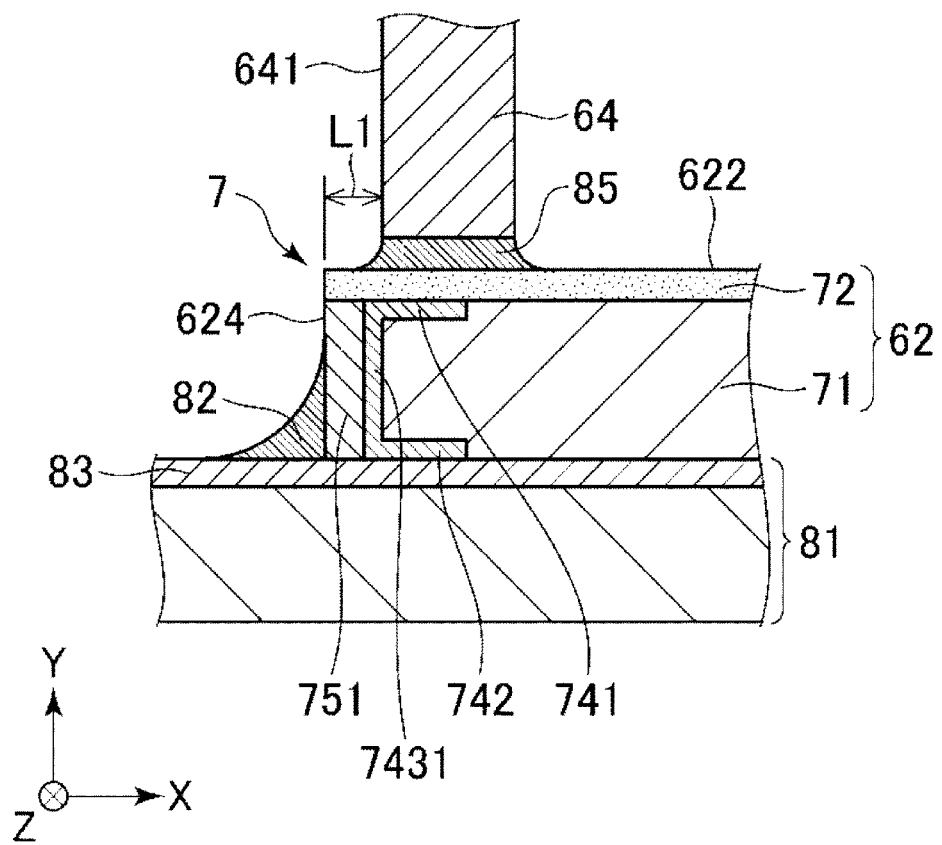
FIG. 10 is a sectional view of a vicinity of a castellation structure of the package shown in FIG. 5.

FIG. 10 is a sectional view of a vicinity of the castellation structure 7 of the package 60 shown in FIG. 5.

The lid body 64 shown in FIG. 10 has a lid body side surface 641 positioned more to the right side than the substrate side surface 624 of the mounting substrate 62. That is, the lid body 64 shown in FIG. 10 is provided more to the inside than an outer periphery of the mounting substrate 62 in plan view.

According to such a package 60, for example, when the oscillator 1 is mounted on a loading substrate 81 as shown in FIG. 10, insulation is improved when the oscillator 1 is fixed to the loading substrate 81 via a solder 82. Specifically, the solder 82 spreads between the castellation structure 7 and a land portion 83 of the loading substrate 81. At this time, the solder 82 forms a fillet, and rises up the first side surface wiring 7431 and a side surface of the first filling member 751. At this time, in the package 60 shown in FIG. 10, since the lid body side surface 641 of the lid body 64 is positioned more to the right than the side surface 624 of the mounting substrate 62, there is an exposed portion of the coating member 72 between the lid body side surface 641 and the substrate side surface 624. Therefore, even though the solder 82 goes up the first side surface wiring 7431 and the first filling member 751, the solder 82 is blocked by the exposed coating member 72 and is prevented from further rising to the lid body 64 side. As a result, a short circuit between the first side surface wiring 7431 and the lid body 64 can be prevented.

A deviation amount L1 between the lid body side surface 641 and the substrate side surface 624 is not particularly limited, but is preferably 0.05 mm or more, and more preferably 0.10 mm or more and 1.0 mm or less. Accordingly, it is possible to more reliably prevent the solder 82 from rising to the lid body 64 while preventing the lid body 64 from becoming smaller than necessary. The solder 82 may be replaced with other bonding materials such as a brazing material.

Further, it is not essential that the lid body side surface 641 and the substrate side surface 624 are displaced, and for example, when a surface of the lid body 64 has insulating properties or when other means for preventing the solder 82 from rising up is taken, the lid body side surface 641 and the substrate side surface 624 may be in a same plane.

Further, as described above, the substrate side surface 624 of the mounting substrate 62 has the first substrate side surface 6241, the second substrate side surface 6242 opposite to the first substrate side surface 6241, the third substrate side surface 6243, and the fourth substrate side surface 6244 opposite to the third substrate side surface 6243. The first cutout portion 731, the first side surface wiring 7431, and the first filling member 751 are provided on the substrate body 71 to correspond to the first substrate side surface 6241.

On the other hand, as described above, the mounting substrate 62 further includes the second cutout portion 732 provided in the substrate body 71 to correspond to the second substrate side surface 6242, the second side surface wiring 7432 provided along the second cutout portion 732, and a second filling member 752 provided in the second cutout portion 732.

According to such a mounting substrate 62, as shown in FIG. 7, since the castellation structure 7 is provided on both the first substrate side surface 6241 and the second substrate side surface 6242 facing each other, a number of castellation structures 7 can be disposed with space from each other. Further, when the oscillator 1 is mounted on the loading substrate 81 as described above, the castellation structure 7 can be a base for forming a fillet by the solder 82 rising up. Therefore, it is easy to secure a sufficient space necessary for forming the fillet of the solder 82, and the oscillator 1 can be stably mounted with sufficient bonding strength.

The number of the castellation structures 7 is not particularly limited.

In addition, as for the substrate body 71 included in the mounting substrate 62, for example, glass epoxy resin which has insulation, ceramics, or the like may be mentioned.

Further, in addition to the internal terminal 741, the external connection terminal 742, the first side surface wiring 7431, and the second side surface wiring 7432 described above, other terminals and wirings (not shown) can be formed by, for example, a method in which a copper foil is applied to an entire surface of the substrate body 71 and is etched, a method in which a metal wiring material such as tungsten or molybdenum is printed on the substrate body 71 and baked and nickel, gold or the like is plated thereon, or the like.

The coating member 72 is made of, for example, a solder resist, a resist film, or the like. Examples of the constituent material of the coating member 72 include a resin material, an inorganic material, or the like. Further, the coating member 72 may be a stacked body in which a plurality of films are stacked.

Further, the first filling member 751 and the second filling member 752 may have insulation property and may have a conductivity, respectively.

When the first filling member 751 and the second filling member 752 have insulation property, respectively, the inside of the first cutout portion 731 and the inside of the second cutout portion 732 can be filled comparatively easily. Further, since an area of a conductive portion exposed on the upper surface 622 and the lower surface 623 of the mounting substrate 62 is reduced, the first side surface wiring 7431 and the internal terminal 741 which are electrically connected to the first side surface wiring 7431 can be more reliably insulated from the lid body 64.

In this case, examples of the constituent material of the first filling member 751 and the second filling member 752 include a resin material, a ceramic material, and a glass material, and a resin material is particularly preferably used. Accordingly, when the coating member 72 includes the resin material, affinity between the first filling member 751 and the second filling member 752, and the coating member 72 is improved, and peeling at interface between the first filling member 751 and the second filling member 752, and the coating member 72 is less likely to occur.

Further, in this case, the surfaces of the first filling member 751 and the second filling member 752 may be coated with a conductive material such as plating. Accordingly, a conductivity is imparted to the first filling member 751 and the second filling member 752 which contribute to lowering resistance of the first side surface wiring 7431 and the second side surface wiring 7432 and which can also be used to as a base for the solder 82 to spread.

On the other hand, when the first filling member 751 and the second filling member 752 have a conductivity, respectively, the first filling member 751 and the second filling member 752 function as wiring laid in a thickness direction of the substrate body 71 similar to the first side surface wiring 7431 and the second side surface wiring 7432. Therefore, the resistance of the first side surface wiring 7431 and the second side surface wiring 7432 can be reduced. Further, the first filling member 751 and the second filling member 752 can also be used as a base for the solder 82 to spread.

Figure 11:
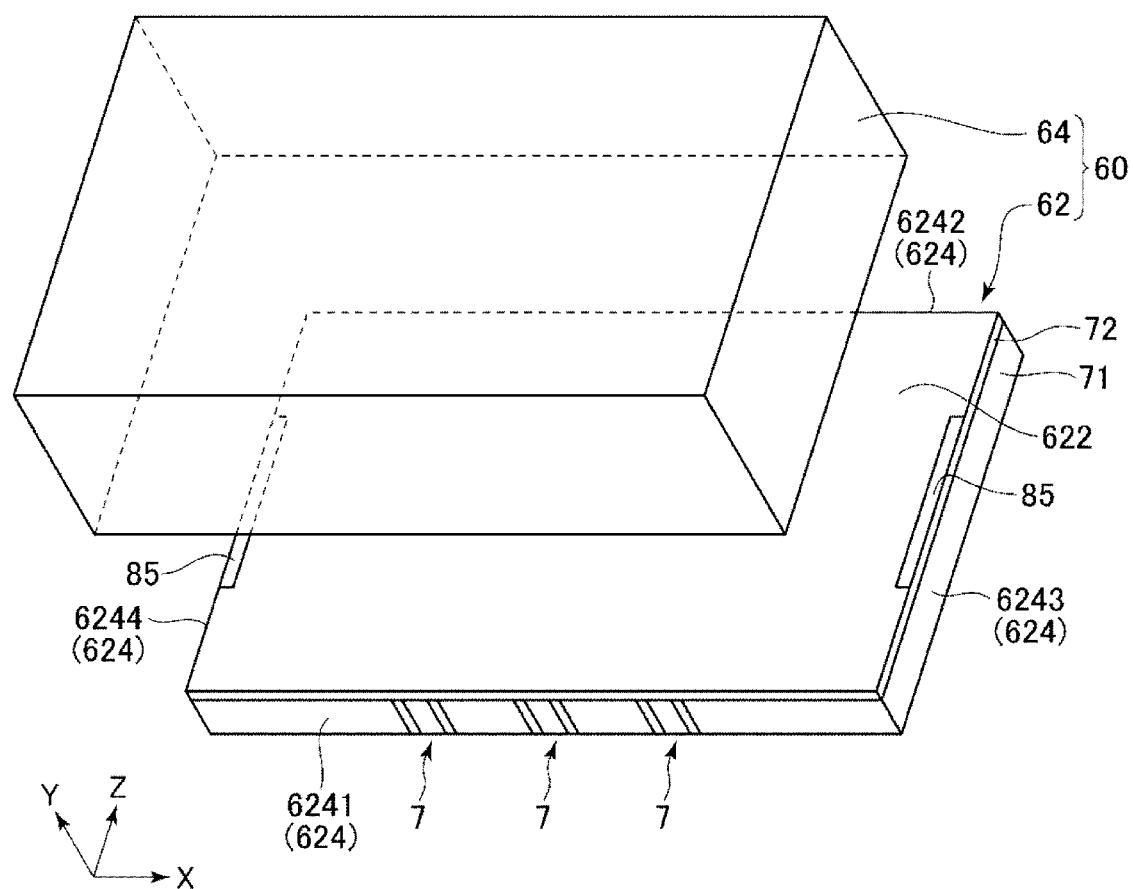
FIG. 11 is an exploded view of the package shown in FIG. 9.

FIG. 11 is an exploded view of the package 60 shown in FIG. 9.

The lid body 64 and the mounting substrate 62 shown in FIG. 11 are bonded via bonding materials 85 provided at two locations. Specifically, as described above, the mounting substrate 62 has the first substrate side surface 6241, the second substrate side surface 6242 opposite to the first substrate side surface 6241, the third substrate side surface 6243, and the fourth substrate side surface 6244 opposite to the third substrate side surface 6243, but the mounting substrate 62 and the lid body 64 are bonded to each other through the bonding material 85 provided along the third substrate side surface 6243 and the fourth substrate side surface 6244 on the upper surface 622 of the mounting substrate 62.

By the bonding at these locations, when for example, as shown in FIG. 7, the castellation structure 7 is provided on the first substrate side surface 6241 and the second substrate side surface 6242, respectively, the contact and short circuit between the castellation structure 7 and the bonding material 85 can be prevented. In other words, by disposing the castellation structure 7 and the bonding material 85 separately on the different substrate side surfaces 624, the contact with each other can be reliably prevented.

Examples of the bonding material 85 include solder, a brazing material, a metal paste, and an adhesive.

Further, as shown in the drawing, the bonding material 85 may be provided to correspond to center portions of the third substrate side surface 6243 and the fourth substrate side surface 6244, respectively, but a position thereof is not particularly limited, and the bonding material 85 may be provided on the entire length of the third substrate side surface 6243 and the fourth substrate side surface 6244, respectively, and may be provided to correspond to both ends of the third substrate side surface 6243 and the fourth substrate side surface 6244. Further, a shape of the bonding material 85 in plan view is not particularly limited.

The oscillator 1 according to the embodiment is described above, but the oscillator according to the present disclosure is not limited to the OCXO described above, and may be for example, a simple packaged crystal oscillator (SPXO), a voltage controlled crystal oscillator (VCXO), a temperature compensated crystal oscillator (TCXO), a voltage controlled SAW oscillator (VCSO), a SAW oscillator (SPSO), a MEMS oscillator, or the like.

Second Embodiment

Next, an oscillator according to a second embodiment will be described.

Figure 12:
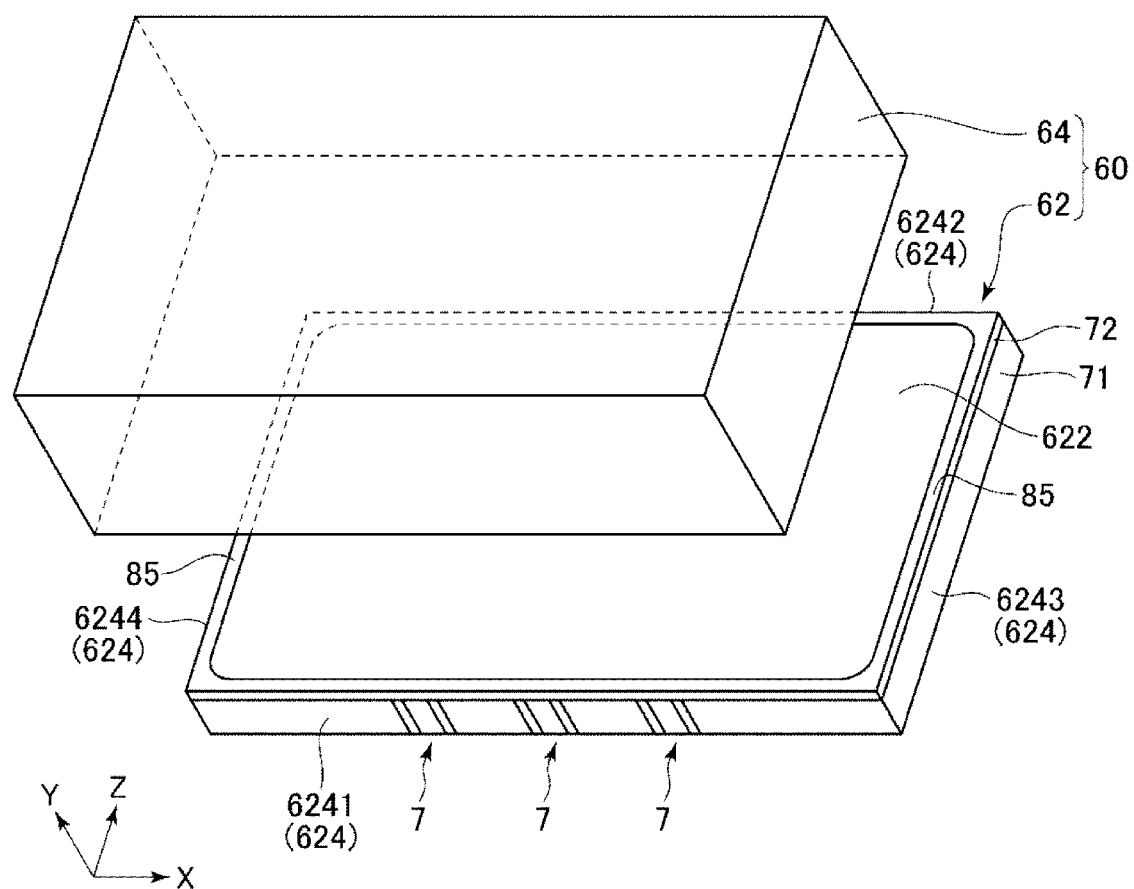
FIG. 12 is an exploded perspective view of a package included in an oscillator according to a second embodiment.

FIG. 12 is an exploded perspective view of a package included in the oscillator according to the second embodiment.

Hereinafter, the second embodiment will be described, but in the following description, differences from the first embodiment will be mainly described, and description of similar matters will be omitted.

The second embodiment is the same as the first embodiment except that a position at which the bonding material 85 bonding the mounting substrate 62 and the lid body 64 is provided is different.

In the first embodiment described above, the bonding material 85 is provided along the third substrate side surface 6243 and the fourth substrate side surface 6244, whereas in the present embodiment, as shown in FIG. 12, the bonding material 85 is provided in a loop shape along an outer edge of the mounting substrate 62.

That is, as described above, the mounting substrate 62 has the first substrate side surface 6241, the second substrate side surface 6242 opposite to the first substrate side surface 6241, the third substrate side surface 6243, and the fourth substrate side surface 6244 opposite to the third substrate side surface 6243, but the mounting substrate 62 and the lid body 64 are bonded to each other through the bonding material 85 provided along the first substrate side surface 6241, the second substrate side surface 6242, the third substrate side surface 6243 and the fourth substrate side surface 6244.

By the bonding at such a position, a gap between the mounting substrate 62 and the lid body 64 can be minimized. Therefore, inflow of outside air through the gap hardly occurs, and heat insulating property of the package 60 can be maximized. As a result, it is easy to more stably maintain the temperature inside the resonator 10 accommodated in the package 60.

Even in the second embodiment as described above, the same effect as in the first embodiment can be obtained.

Third Embodiment

Next, an oscillator according to a third embodiment will be described.

Figure 13:
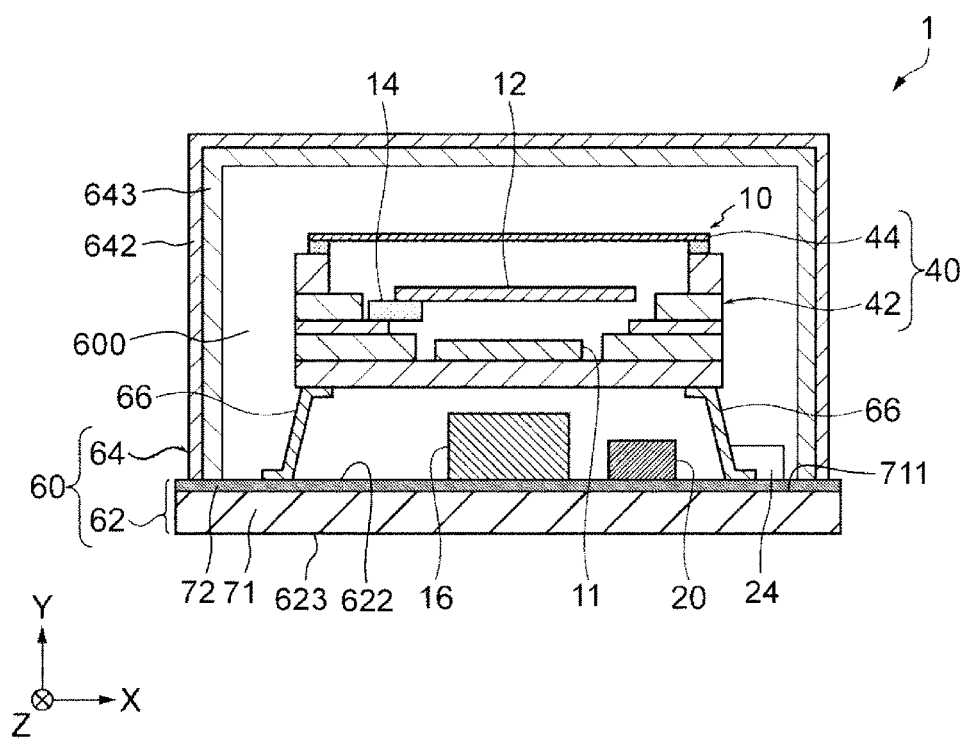
FIG. 13 is a sectional view of an oscillator according to a third embodiment.

FIG. 13 is a sectional view of the oscillator according to the third embodiment.

Hereinafter, the third embodiment will be described, but in the following description, differences from the first embodiment will be mainly described, and description of similar matters will be omitted.

The third embodiment is the same as the first embodiment except that a configuration of the lid body 64 is different.

The lid body 64 shown in FIG. 13 includes an inner layer 643 made of a metal material and an outer layer 642 made of a resin material. In other words, the lid body 64 shown in FIG. 13 has a two-layer structure in which the outer surface of the inner layer 643 is covered with the outer layer 642, and thus further includes an insulating member which covers a surface.

According to such a configuration, since an outer surface of the lid body 64 is covered with a resin material having a lower thermal conductivity than a metal material, the heat insulation of the package 60 can be further improved. On the other hand, since the lid body 64 includes the metal material as in the first embodiment, the lid body 64 has a shield effect.

The thickness of the outer layer 642 is not particularly limited, but is preferably 0.010 mm or more and 2.0 mm or less, and more preferably 0.050 mm or more and 1.0 mm or less. Accordingly, a necessary and sufficient heat insulation effect can be obtained.

Further, the resin material contained in the outer layer 642 is not particularly limited, and may be any resin material. In addition to the resin material, an optional additive or the like may be added to the outer layer 642.

Furthermore, positions of the inner layer 643 and the outer layer 642 may be reversed with respect to each other. That is, the inner layer 643 may be made of a resin material, and the outer layer 642 may be made of a metal material. Even in this case, the same heat insulating effect and shield effect as described above can be obtained.

The inner layer 643 and the outer layer 642 do not have the two-layer structure in the entirety of the lid body 64 but may have a one-layer structure in any one portion of the lid body 64.

Further, in addition to the inner layer 643 and the outer layer 642, an arbitrary preferable layer may be added to at least one of an inside of the inner layer 643, a space between the inner layer 643 and the outer layer 642, and an outside of the outer layer 642.

In the third embodiment as described above, the same effect as in the first embodiment can be obtained.

The Method of Manufacturing the Oscillator

Next, a method of manufacturing the oscillator according to the embodiment will be described.

Figure 14:
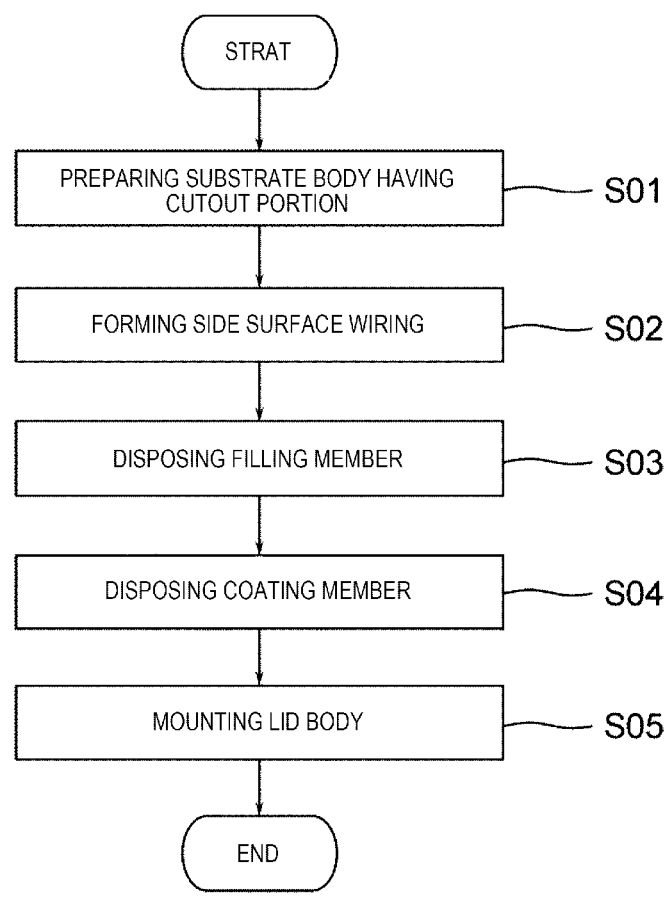
FIG. 14 is a process diagram for describing a method of manufacturing the oscillator according to the embodiment.

FIG. 14 is a process diagram for describing the method of manufacturing the oscillator according to the embodiment. FIGS. 15 to 18 are views for describing the method of manufacturing the oscillator including the package shown in FIG. 11, respectively.

The method of manufacturing the oscillator 1 according to the embodiment, as shown in FIG. 14, includes preparing the substrate body 71 having the upper surface 711 (first substrate body main surface), the lower surface 712 (second substrate body main surface) having a front and back relationship with the upper surface 711, and the substrate body side surface 713 provided with the first cutout portion 731 and the second cutout portion 732, forming the first side surface wiring 7431 along the first cutout portion 731 and the second side surface wiring 7432 along the second cutout portion 732, providing the first filling member 751 in the first cutout portion 731 and the second filling member 752 in the second cutout portion 732, providing the insulating coating member 72 on the upper surface 711 of the substrate body 71, and mounting the lid body 64 on the coating member 72 to obtain the package 60 shown in FIG. 11. Hereinafter, such a manufacturing method will be sequentially described.

[1] Preparing the Substrate having the Cutout Portion S01

Figure 15:
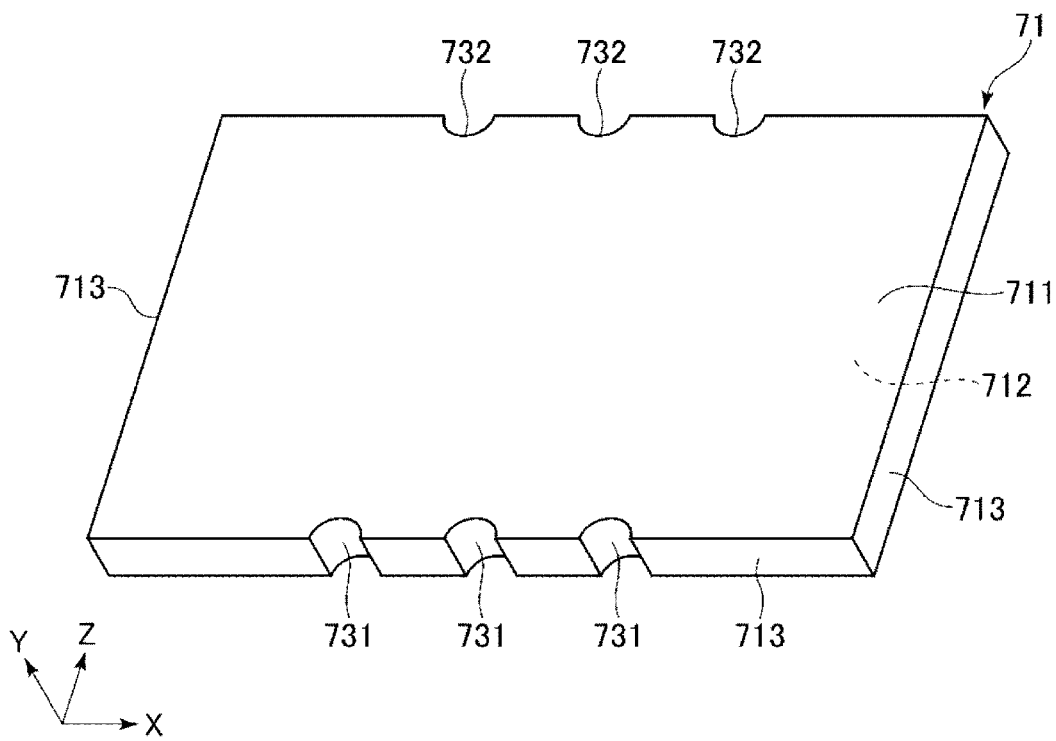
FIG. 15 is a view for describing a method of manufacturing the oscillator including the package shown in FIG. 11.

First, as shown in FIG. 15, prepare the substrate body 71 having the upper surface 711, the lower surface 712, and the substrate body side surface 713 provided with the first cutout portion 731 and the second cutout portion 732.

[2] Forming the Side Surface Wiring S02

Figure 16:
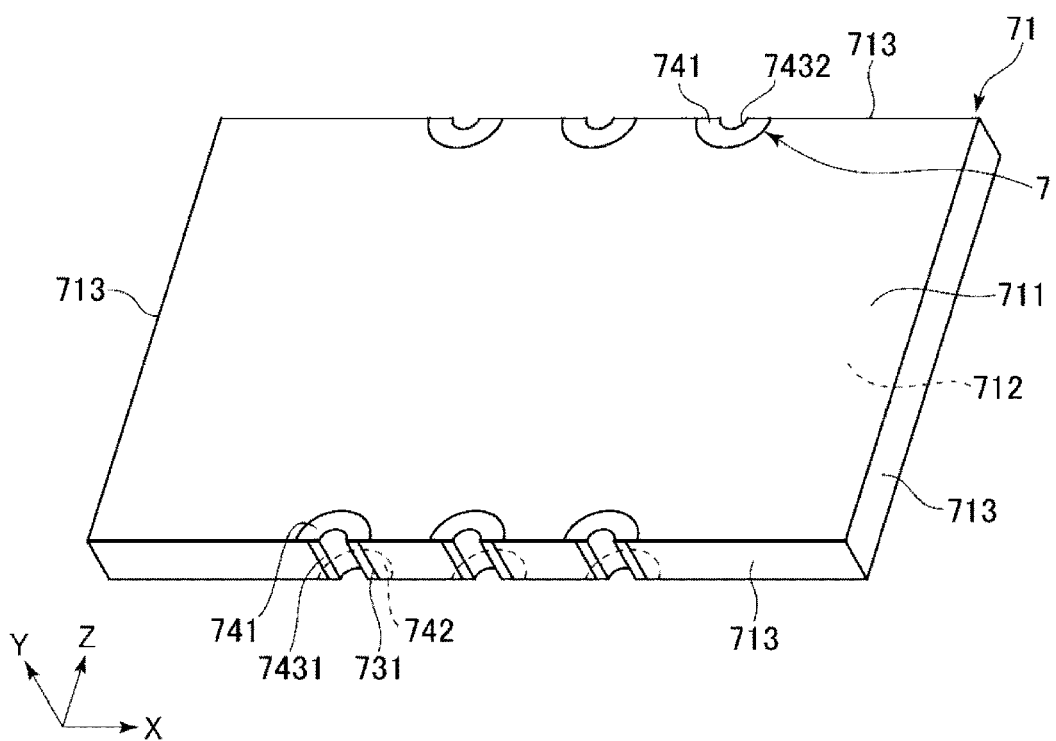
FIG. 16 is a view for describing the method of manufacturing the oscillator including the package shown in FIG. 11.

Next, as shown in FIG. 16, form the first side surface wiring 7431 along the first cutout portion 731. Similarly, form the second side surface wiring 7432 shown in FIG. 16 along the second cutout portion 732 shown in FIG. 15. Further, together with this, form the internal terminal 741 and the external connection terminal 742. Accordingly, the internal terminal 741 and the external connection terminal 742 are electrically connected with each other via the first side surface wiring 7431 and the second side surface wiring 7432.

The order of formation described above is not limited thereto. For example, the internal terminal 741 and the external connection terminal 742 may be provided in advance on a base material for forming the substrate body 71, and then the first cutout portion 731 and the second cutout portion 732 may be formed in the base material and the first side surface wiring 7431 and the second side surface wiring 7432 may be formed.

[3] Disposing the Filling Member S03

Figure 17:
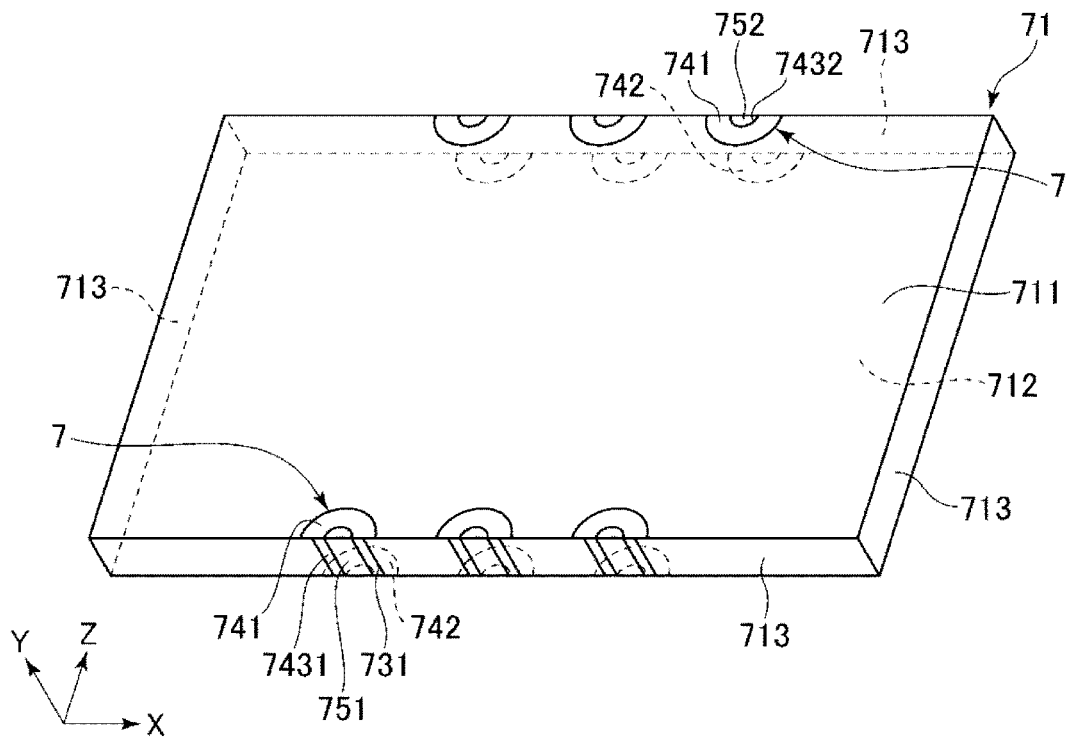
FIG. 17 is a view for describing the method of manufacturing the oscillator including the package shown in FIG. 11.

Next, as shown in FIG. 17, the first filling member 751 is provided in the first cutout portion 731. Similarly, the second filling member 752 shown in FIG. 17 is provided in the second cutout portion 732 shown in FIG. 15. The first filling member 751 and the second filling member 752 are formed by, for example, a method of solidifying or curing after applying a liquid material or a paste material, a method of filling by plating, or the like.

[4] Disposing the Coating Member S04

Figure 18:
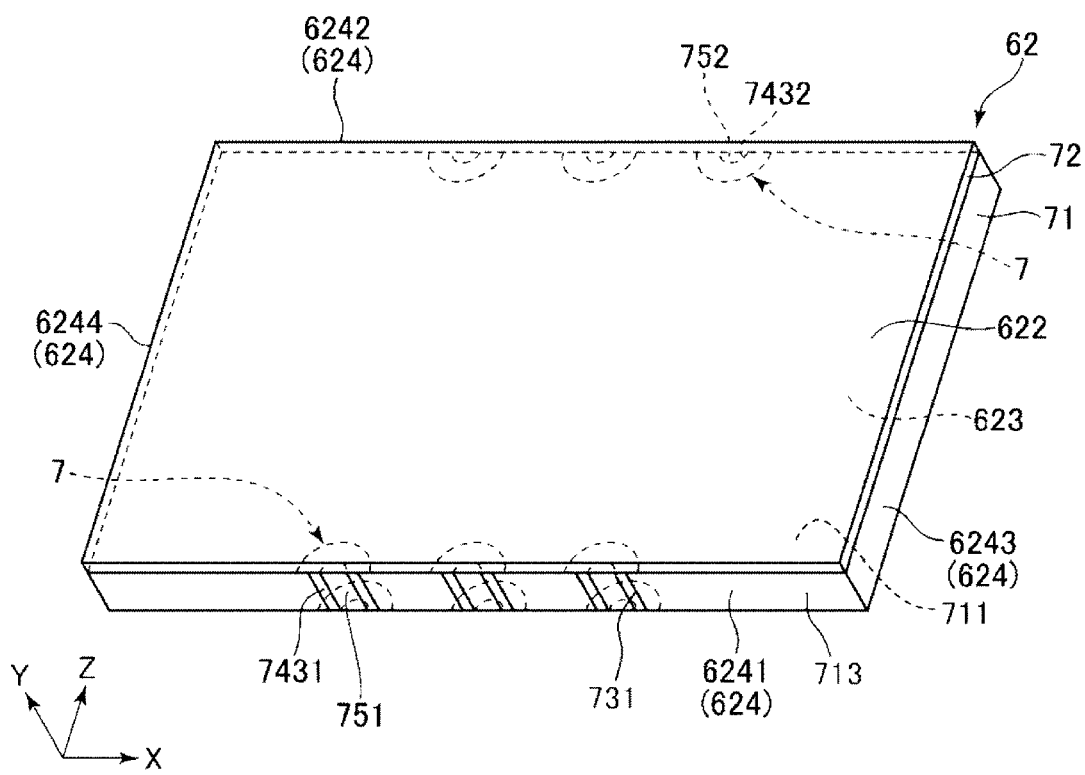
FIG. 18 is a view for describing the method of manufacturing the oscillator including the package shown in FIG. 11.

Next, as shown in FIG. 18, the insulating coating member 72 is provided on the upper surface 711 of the substrate body 71. The coating member 72 is formed by, for example, a method of solidifying or curing after applying a liquid material, a vapor phase deposition method, or the like. The coating member 72 is provided so as to cover not only the upper surface 711 of the substrate body 71 but also the first side surface wiring 7431 and the second side surface wiring 7432, as well as the first filling member 751 and the second filling member 752. Accordingly, the mounting substrate 62 is obtained. It is preferable that the coating member 72 is avoided at a location in which a terminal or the like is provided.

[5] Mounting the Lid Body S05

Next, the resonator 10 and other components are mounted on the mounting substrate 62. Thereafter, the lid body 64 is mounted on the coating member 72 and bonded via the bonding material 85. Accordingly, the package 60 shown in FIG. 11 is obtained, and the oscillator 1 shown in FIG. 2 is obtained.

According to the method of manufacturing as described above, the coating member 72 can insulate the first side surface wiring 7431 or the internal terminal 741 electrically connected thereto from the lid body 64. Therefore, it is not necessary to provide the missing portion in the lid body 64 as in the reference example. Therefore, the heat insulation of the package 60 constituted with the mounting substrate 62 and the lid body 64 is increased, and the temperature inside the resonator 10 accommodated in the package 60 can be easily maintained at a predetermined temperature. Therefore, the oscillator 1 in which the precision of the output frequency is stabilized can be manufactured.

Electronic Apparatus

Figure 19:
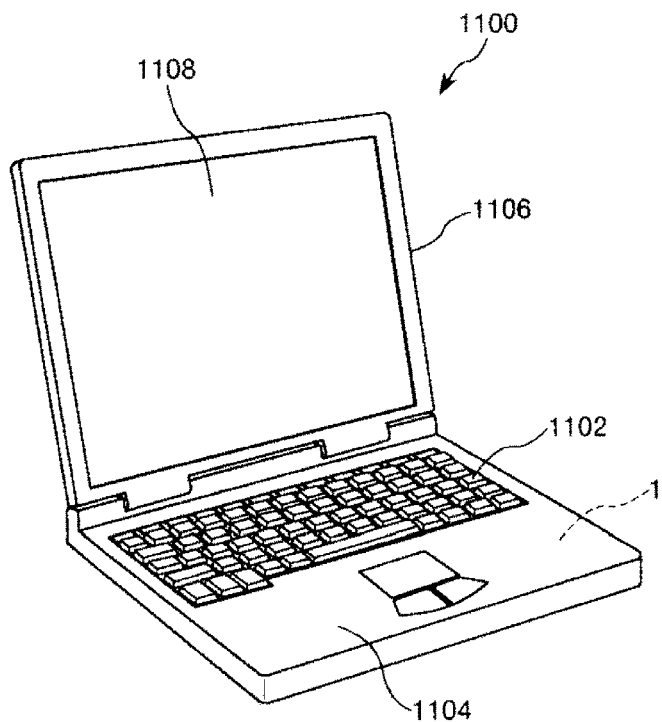
FIG. 19 is a perspective view showing a mobile personal computer which is an electronic apparatus according to the embodiment.

FIG. 19 is a perspective view showing a mobile personal computer which is an electronic apparatus according to the embodiment.

In FIG. 19, a personal computer 1100 is constituted with a body portion 1104 including a keyboard 1102 and a display unit 1106 provided with a display 1108, and the display unit 1106 is rotatably supported via a hinge structure with respect to the body portion 1104. Such a personal computer 1100 incorporates that oscillator 1 which generates a reference clock signal or the like.

Figure 20:
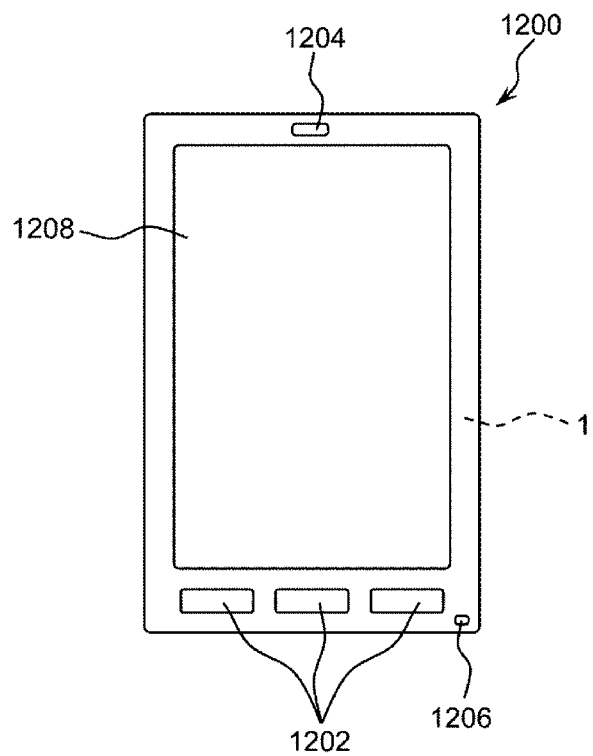
FIG. 20 is a plan view showing a mobile phone which is an electronic apparatus according to the embodiment.

FIG. 20 is a plan view showing a mobile phone which is an electronic apparatus according to the embodiment.

In FIG. 20, the mobile phone 1200 includes an antenna (not shown), a plurality of operation buttons 1202, an earpiece 1204, and a mouthpiece 1206, and a display 1208 is disposed between the operation buttons 1202 and the earpiece 1204. Such a mobile phone 1200 incorporates the oscillator 1 which generates a reference clock signal or the like.

Figure 21:
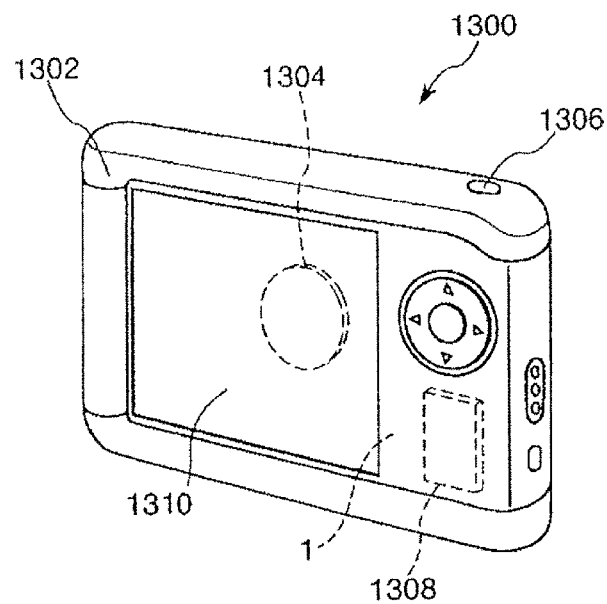
FIG. 21 is a perspective view showing a digital still camera which is an electronic apparatus according to the embodiment.

FIG. 21 is a perspective view showing a digital still camera which is an electronic apparatus according to the embodiment.

In FIG. 21, a display 1310 is provided on a back of a case 1302 in a digital still camera 1300, is configured to display based on an image pickup signal by a CCD, and the display 1310 functions as a finder which displays an object as an electronic image. A light receiving unit 1304 including an imaging optical system such as an optical lens, a CCD, or the like is provided on a front side of the case 1302, that is, a back side in the drawing. When a photographer confirms a subject image displayed on the display 1310 and presses a shutter button 1306, the CCD image pickup signal at that time is transferred and stored in the memory 1308. Such a digital still camera 1300 incorporates the oscillator 1 which generates a reference clock signal or the like.

The electronic apparatus as described above includes the oscillator 1. According to such an electronic apparatus, it is possible to improve characteristics of the electronic apparatus by using a high precision reference clock signal generated by the oscillator 1.

In addition to the personal computer of FIG. 19, the mobile phone of FIG. 20, the digital still camera of FIG. 21, the electronic apparatus including the oscillator 1 may be, for example, a smart phone, a tablet terminal, a timepiece including a smart watch, an ink jet type discharge apparatus (for example, an ink jet printer), a wearable terminal such as a head-mounted display (HMD), a laptop personal computer, a television, a video camera, a video tape recorder, a car navigation apparatus, a pager, an electronic notebook with a communication function, an electronic dictionary, a calculator, an electronic game apparatus, a word processor, a workstation, a video telephone, a crime prevention TV monitor, an electronic binoculars, a POS terminal, a medical apparatus (for example, an electronic thermometer, a blood pressure monitor, a blood glucose meter, an electrocardiogram measurement device, an ultrasonic diagnostic device, an electronic endoscope), a fish detection instrument, various measuring apparatus, a measuring instrument for a vehicle, an aircraft, and a ship, abase station for a mobile phone, a flight simulator, or the like.

Vehicle

Figure 22:
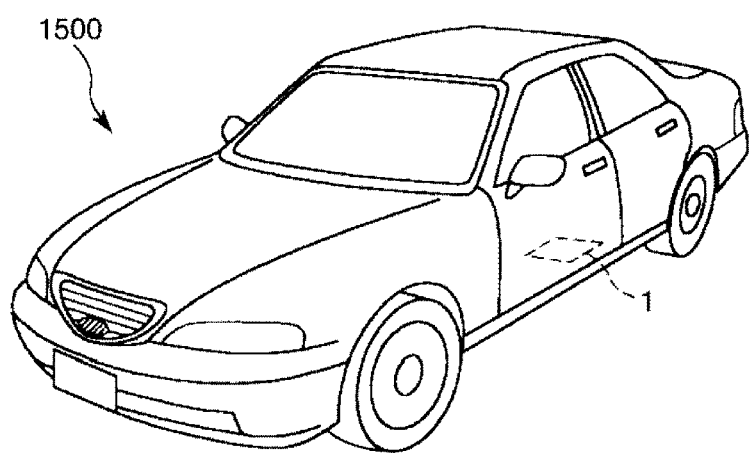
FIG. 22 is a perspective view showing an automobile which is a vehicle according to the embodiment.

FIG. 22 is a perspective view showing an automobile which is a vehicle according to the embodiment.

The oscillator 1 described above is built in an automobile 1500 shown in FIG. 22. The oscillator 1 can be widely applied to an electronic control unit (ECU) such as for example, a keyless entry, an immobilizer, a car navigation system, a car air conditioner, an anti-lock brake system (ABS), an air bag, a tire pressure monitoring system (TPMS), an engine control, a brake system, a battery monitor of a hybrid automobile and an electric automobile, a vehicle body posture control system, or the like.

The vehicle as described above includes the oscillator 1. According to such a vehicle, it is possible to improve characteristics of the vehicle by using a high precision reference clock signal generated by the oscillator 1.

In addition to the automobile shown in FIG. 22, the vehicle including the oscillator 1 may be, for example, a robot, a drone, a two-wheeled vehicle, an aircraft, a ship, a train, a rocket, a space ship, or the like.

As mentioned above, although the oscillator, the method of manufacturing the oscillator, the electronic apparatus, and the vehicle according to the present disclosure are described based on the embodiments with illustration, the present disclosure is not limited thereto, a constitution of each portion can be replaced with an arbitrary constitution having the same function. Further, any other component may be added to the embodiment. Furthermore, two or more of the embodiments may be combined. Moreover, processing for arbitrary purposes may be added to the method of manufacturing, and processing order may be changed.

What is claimed is:

1. An oscillator comprising:
    a substrate having a first substrate body main surface, a substrate body side surface provided with a cutout portion, and a second substrate body main surface;
    a lid body bonded to the substrate and including a metal material,
        a side surface wiring provided along the cutout portion;
        a filling member provided in the cutout portion; and
        an insulating coating member provided on the first substrate body main surface so as to cover the entirety of the first substrate body main surface,
    wherein the filling member extends in the cutout portion from the first substrate body main surface to the second substrate main body surface, and
    wherein the insulating coating member covers a top surface of the filling member that is level with the first substrate body main surface and covers an upper end of the side surface wiring that is placed on the first substrate body main surface and extends from the cutoff portion.

2. The oscillator according to claim 1, wherein the filling member has an insulating property.

3. The oscillator according to claim 1, wherein the filling member has a conductivity.

4. The oscillator according to claim 1, wherein
the lid body is provided at a more inner location than an outer periphery of the substrate in plan view.

5. The oscillator according to claim 1, wherein
the substrate has, as the substrate body side surface, a first substrate side surface, a second substrate side surface which is opposite to the first substrate side surface, a third substrate side surface, and a fourth substrate side surface which is opposite to the third substrate side surface, the cutout portion is a first cutout portion provided in the substrate body to correspond to the first substrate side surface, the side surface wiring is a first side surface wiring provided along the first cutout portion, the filling member is a first filling member provided in the first cutout portion, and the substrate further includes
a second cutout portion provided in the substrate body to correspond to the second substrate side surface,
a second side surface wiring provided along the second cutout portion, and
a second filling member provided in the second cutout portion.

6. The oscillator according to claim 1, wherein
the substrate has, as the substrate body side surface, a first substrate side surface, a second substrate side surface which is opposite to the first substrate side surface, a third substrate side surface, and a fourth substrate side surface which is opposite to the third substrate side surface, and the substrate and the lid body are bonded via a bonding material provided along the third substrate side surface and the fourth substrate side surface.

7. The oscillator according to claim 1, wherein
the substrate has, as the substrate body side surface, a first substrate side surface, a second substrate side surface which is opposite to the first substrate side surface, a third substrate side surface, and a fourth substrate side surface which is opposite to the third substrate side surface, and the substrate and the lid body are bonded via a bonding material provided along the first substrate side surface, the second substrate side surface, the third substrate side surface, and the fourth substrate side surface.

8. The oscillator according to claim 1, further comprising an insulating member which covers a surface of the lid body.

9. A method of manufacturing an oscillator, comprising:
preparing a substrate body having a first substrate body main surface, a substrate body side surface provided with a cutout portion, and a second substrate body main surface;

forming a side surface wiring along the cutout portion;

providing a filling member in the cutout portion so that the filling member extends in the cutout portion from the first substrate body main surface to the second substrate body main surface;

preparing an insulating coating member on the first substrate body main surface so as to cover the entirety of the first substrate body main surface, the insulating coating member covering a top surface of the filling member that is level with the first substrate body main surface and covering an upper end of the side surface wiring that is placed on the first substrate body main surface and extends from the cutoff portion; and mounting a lid body on the insulating coating member.

10. An electronic apparatus comprising the oscillator according to claim 1.

11. A vehicle comprising the oscillator according to claim 1.

* * * * *